United States Patent
Nakazawa et al.

(10) Patent No.: US 11,282,965 B2
(45) Date of Patent: Mar. 22, 2022

(54) FABRICATION METHOD OF SEMICONDUCTOR DEVICE

(71) Applicant: Semiconductor Energy Laboratory Co., Ltd., Atsugi (JP)

(72) Inventors: Yasutaka Nakazawa, Tochigi (JP); Takashi Hamochi, Shimotsuga (JP); Takayuki Ohide, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/959,259

(22) PCT Filed: Jan. 11, 2019

(86) PCT No.: PCT/IB2019/050206
§ 371 (c)(1),
(2) Date: Jun. 30, 2020

(87) PCT Pub. No.: WO2019/142080
PCT Pub. Date: Jul. 25, 2019

(65) Prior Publication Data
US 2020/0335609 A1    Oct. 22, 2020

(30) Foreign Application Priority Data

Jan. 19, 2018  (JP) .............................. JP2018-007194

(51) Int. Cl.
*H01L 29/786*  (2006.01)
*H01L 21/02*   (2006.01)
(Continued)

(52) U.S. Cl.
CPC .... *H01L 29/7869* (2013.01); *H01L 21/02274* (2013.01); *H01L 21/02565* (2013.01);
(Continued)

(58) Field of Classification Search
CPC ......... H01L 21/02123; H01L 21/02164; H01L 21/02271; H01L 21/02274;
(Continued)

(56) References Cited

U.S. PATENT DOCUMENTS

| 8,748,215 B2 | 6/2014 | Yamazaki |
| 9,111,804 B2 | 8/2015 | Yamazaki et al. |

(Continued)

FOREIGN PATENT DOCUMENTS

| CN | 102668028 A | 9/2012 |
| CN | 104916568 A | 9/2015 |

(Continued)

OTHER PUBLICATIONS

International Search Report (Application No. PCT/IB2019/050206) dated Apr. 16, 2019.

(Continued)

*Primary Examiner* — Cheung Lee
(74) *Attorney, Agent, or Firm* — Robinson Intellectual Property Law Office; Eric J. Robinson

(57) ABSTRACT

A semiconductor device with favorable electrical characteristics is provided. A semiconductor device with stable electrical characteristics is provided. A highly reliable display device is provided. The semiconductor device is fabricated by a method that includes a first step of forming a semiconductor layer containing a metal oxide, a second step of forming a conductive film over the semiconductor layer, a third step of etching the conductive film such that the conductive film is divided over the semiconductor layer and a portion of the semiconductor layer is uncovered, and a fourth step of performing first treatment on the conductive film and the portion of the semiconductor layer. The conductive film contains copper, silver, gold, or aluminum. The first treatment is plasma treatment in an atmosphere con- (Continued)

taining a mixed gas of a first gas containing an oxygen element and a second gas containing a hydrogen element.

13 Claims, 24 Drawing Sheets

(51) Int. Cl.
   *H01L 21/443* (2006.01)
   *H01L 21/4763* (2006.01)
   *H01L 29/45* (2006.01)
   *H01L 29/66* (2006.01)
   *G02F 1/1368* (2006.01)
   *H01L 27/32* (2006.01)

(52) U.S. Cl.
   CPC ...... *H01L 21/02631* (2013.01); *H01L 21/443* (2013.01); *H01L 21/47635* (2013.01); *H01L 29/45* (2013.01); *H01L 29/66969* (2013.01); *H01L 29/78648* (2013.01); *G02F 1/1368* (2013.01); *H01L 27/3262* (2013.01)

(58) Field of Classification Search
   CPC ......... H01L 21/02315; H01L 21/02518; H01L 21/02554; H01L 21/02565; H01L 21/02612; H01L 21/02631; H01L 21/44; H01L 21/441; H01L 21/443; H01L 21/47635; H01L 27/1214; H01L 27/1225; H01L 27/1259; H01L 27/1262; H01L 29/45; H01L 29/66007; H01L 29/66969; H01L 29/786; H01L 29/7869; H01L 29/78696

See application file for complete search history.

(56) References Cited

U.S. PATENT DOCUMENTS

| | | | |
|---|---|---|---|
| 9,293,598 B2 | 3/2016 | Yamazaki et al. | |
| 9,337,342 B2 | 5/2016 | Okazaki et al. | |
| 9,379,141 B2 | 6/2016 | Yamazaki et al. | |
| 9,520,287 B2 | 12/2016 | Yamazaki | |
| 9,711,610 B2 | 7/2017 | Yamazaki et al. | |
| 9,761,734 B2 | 9/2017 | Ishihara et al. | |
| 9,941,324 B2 | 4/2018 | Nara | |
| 10,079,310 B2 | 9/2018 | Yamazaki | |
| 10,170,599 B2 | 1/2019 | Okazaki et al. | |
| 10,290,720 B2 | 5/2019 | Yamazaki et al. | |
| 10,347,771 B2 | 7/2019 | Yamazaki | |
| 2010/0207118 A1* | 8/2010 | Sakata | H01L 29/7869 257/43 |
| 2011/0127521 A1 | 6/2011 | Yamazaki | |
| 2013/0270549 A1 | 10/2013 | Okazaki et al. | |
| 2014/0183529 A1 | 7/2014 | Yamazaki et al. | |
| 2016/0181431 A1 | 6/2016 | Yamazaki | |
| 2016/0322416 A1 | 11/2016 | Nara | |

FOREIGN PATENT DOCUMENTS

| | | |
|---|---|---|
| CN | 106098713 A | 11/2016 |
| JP | 2011-135066 A | 7/2011 |
| JP | 2011-228622 A | 11/2011 |
| JP | 2014-007381 A | 1/2014 |
| JP | 2014-007399 A | 1/2014 |
| JP | 2014-143410 A | 8/2014 |
| JP | 2015-188068 A | 10/2015 |
| JP | 2015-198223 A | 11/2015 |
| JP | 2016-213432 A | 12/2016 |
| KR | 2012-0109526 A | 10/2012 |
| KR | 2013-0116204 A | 10/2013 |
| KR | 2015-0106359 A | 9/2015 |
| TW | 201137984 | 11/2011 |
| TW | 201546935 | 12/2015 |
| WO | WO-2011/065216 | 6/2011 |

OTHER PUBLICATIONS

Written Opinion (Application No. PCT/IB2019/050206) dated Apr. 16, 2019.

* cited by examiner

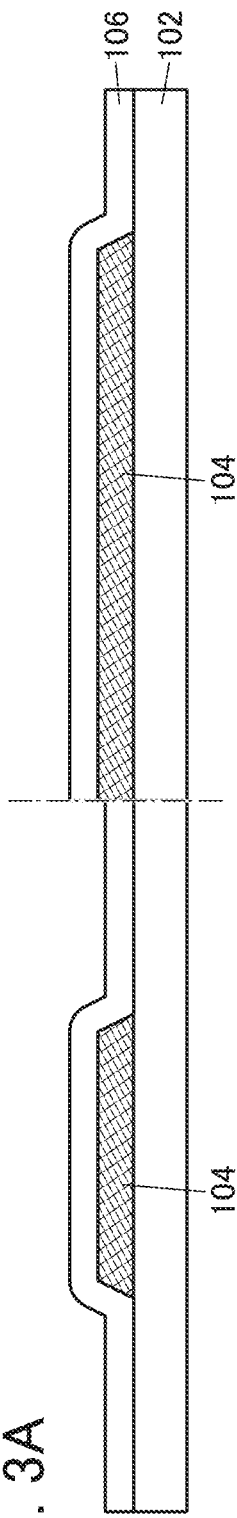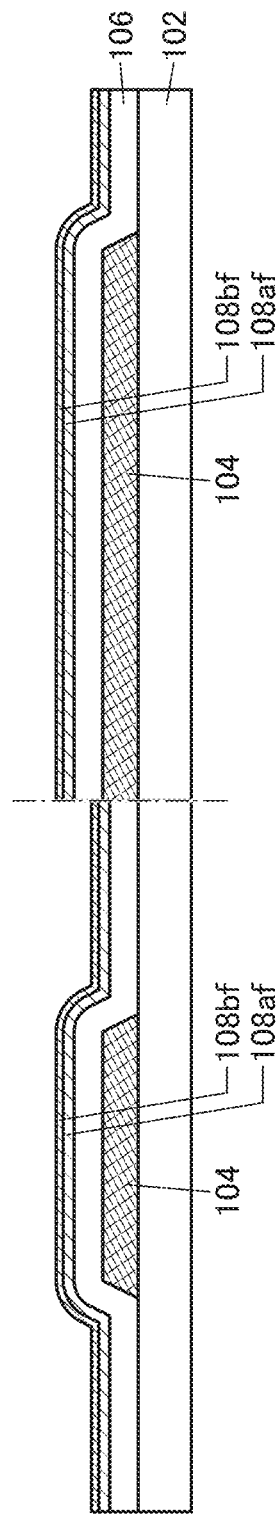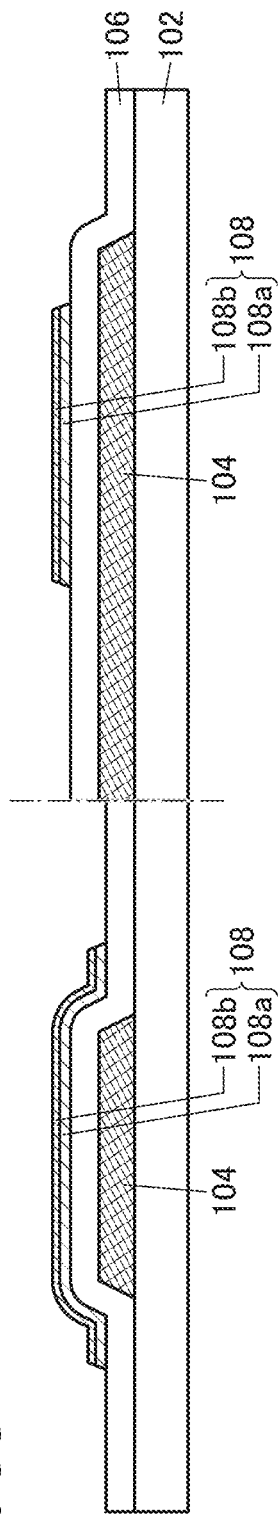

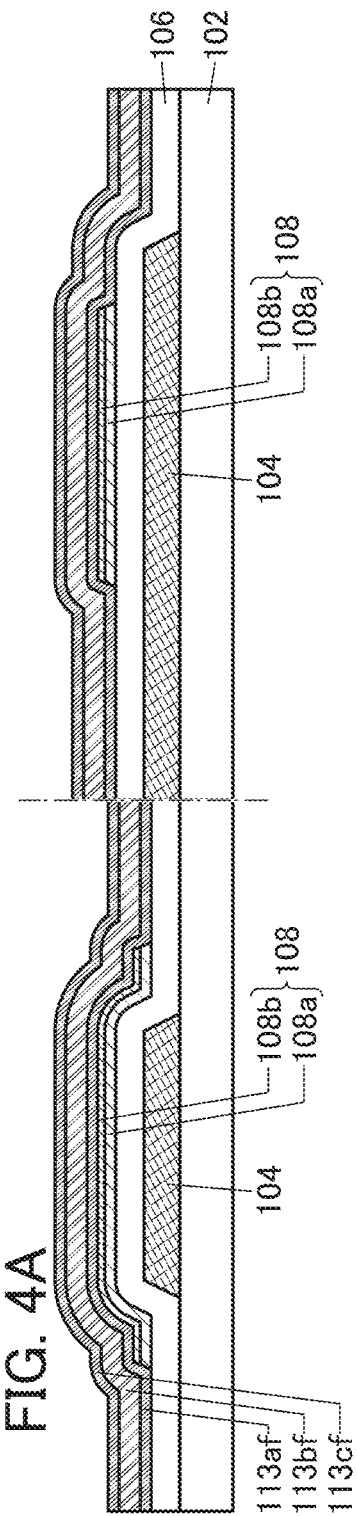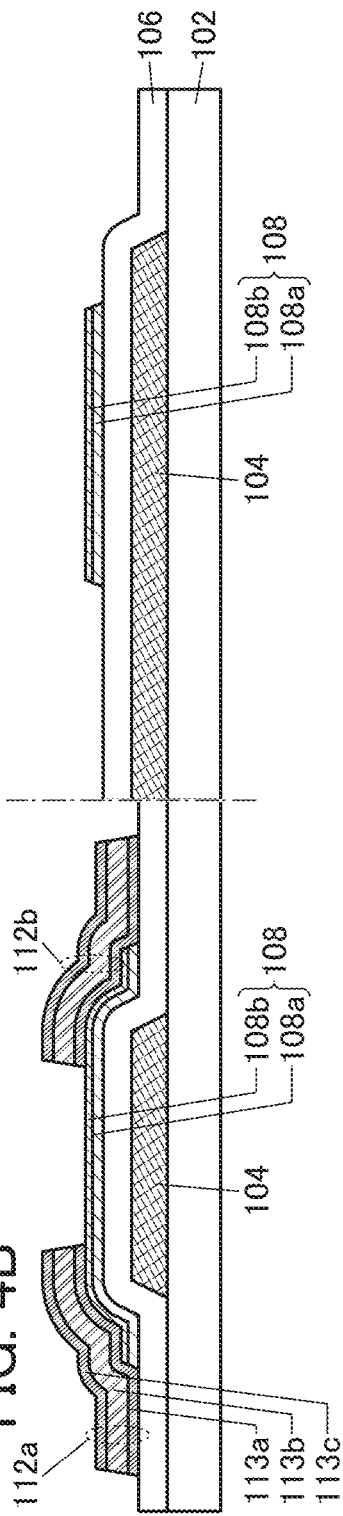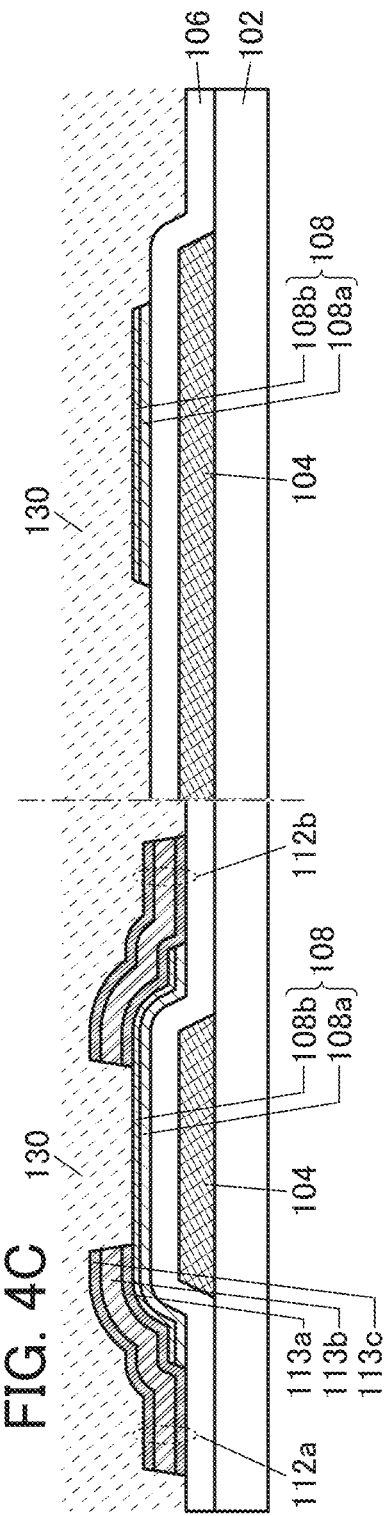

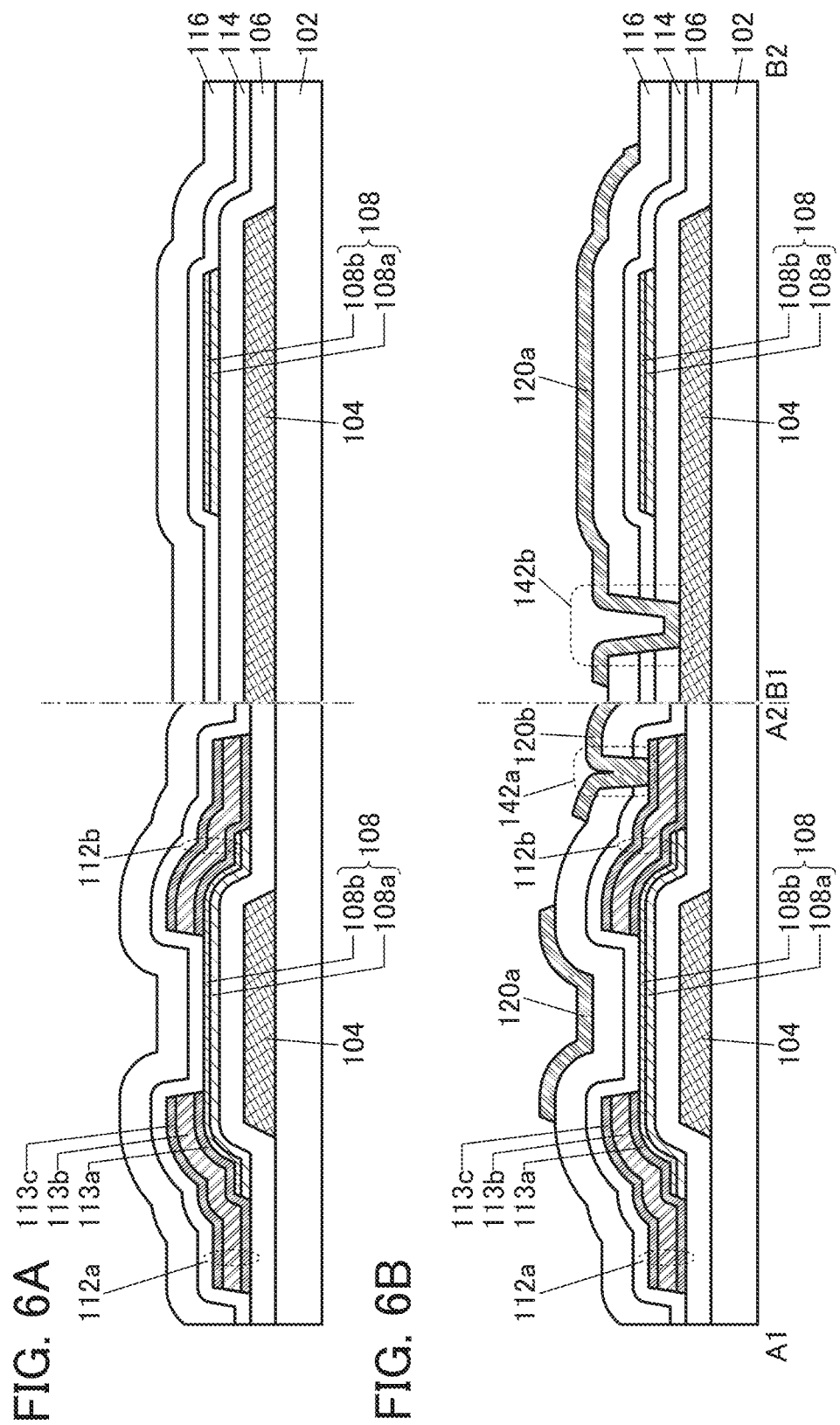

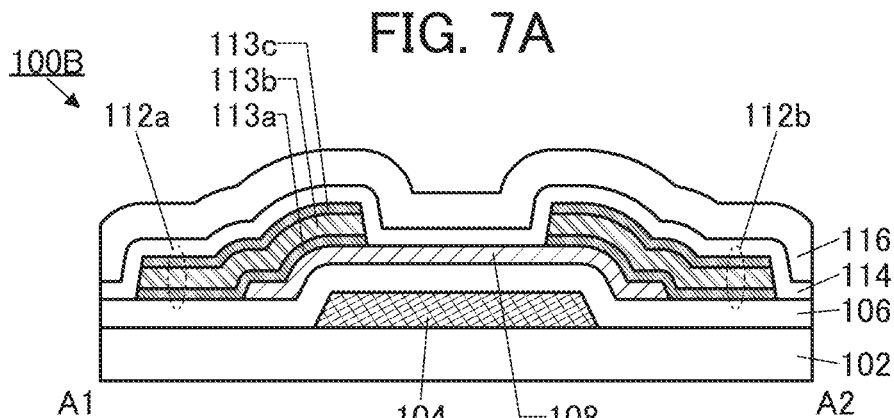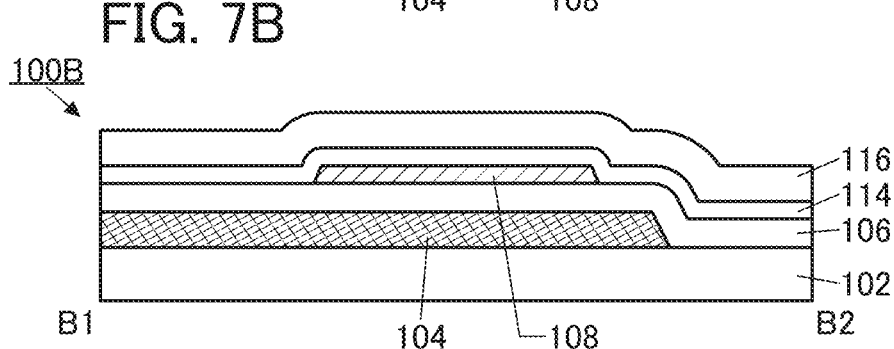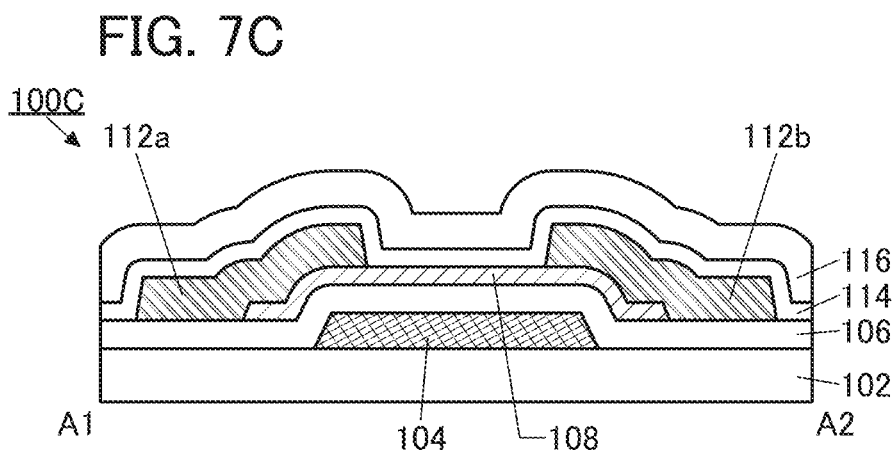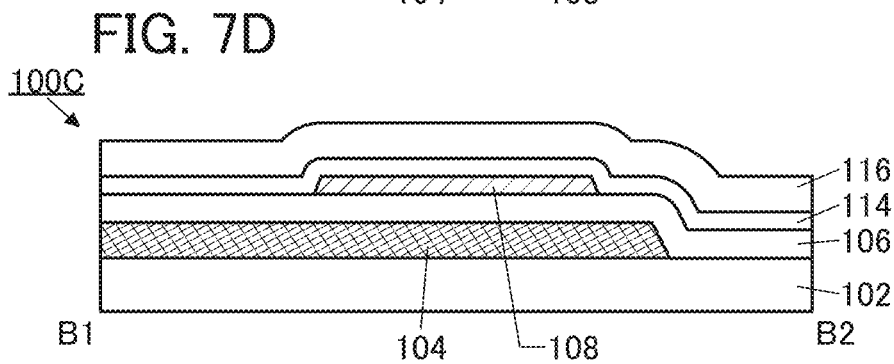

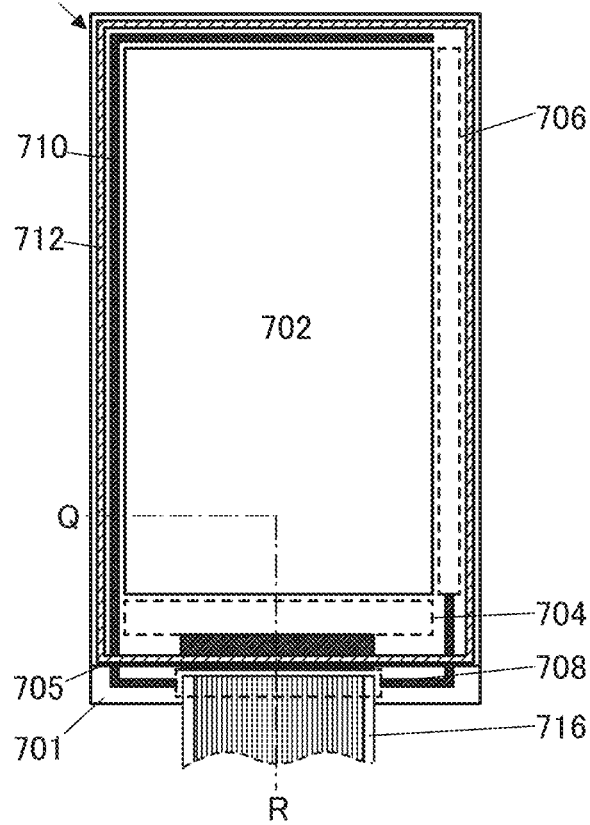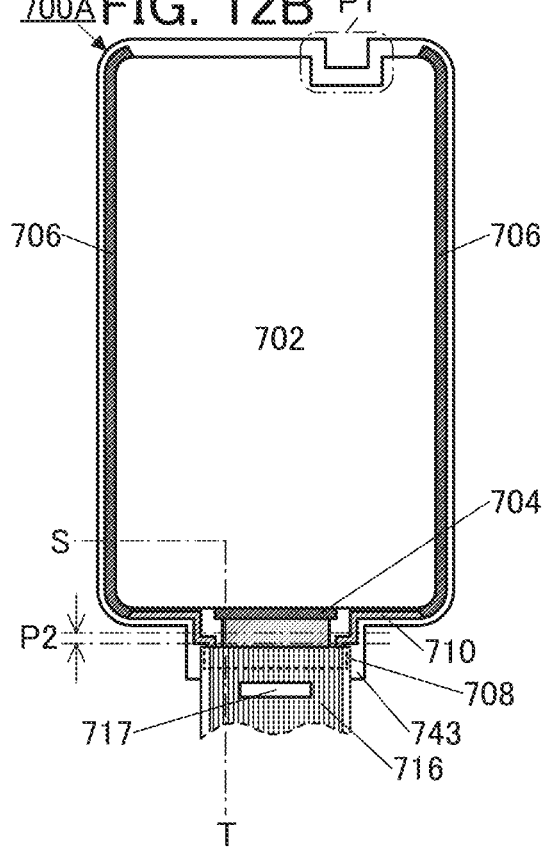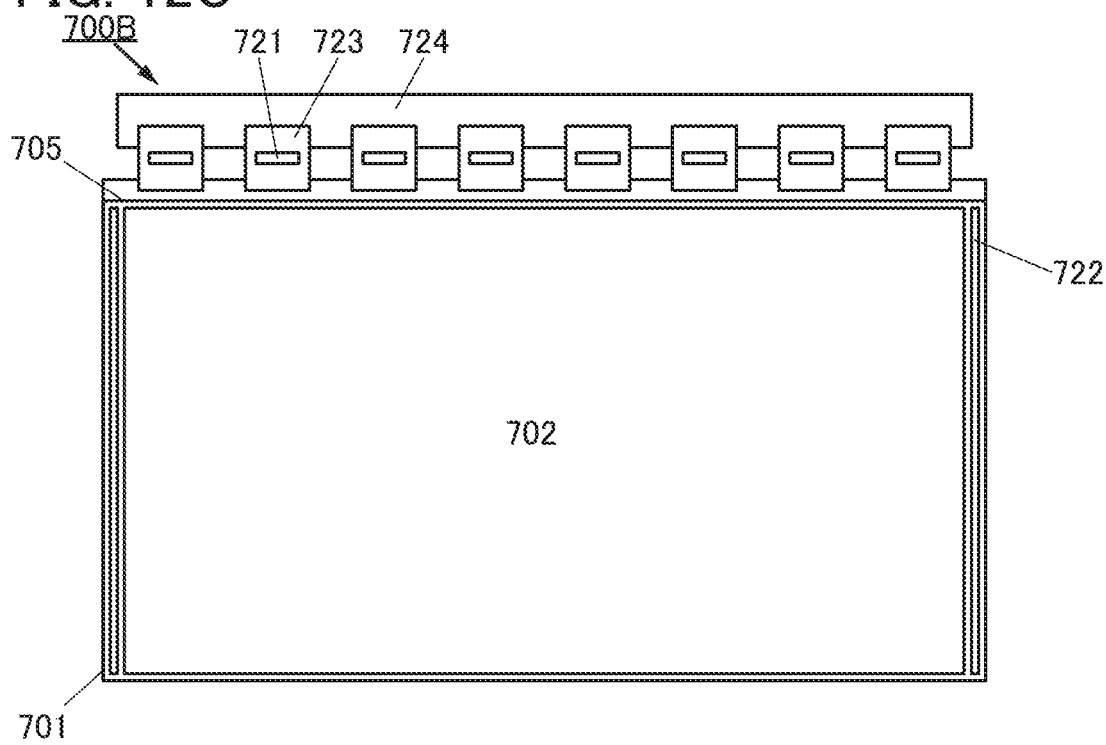

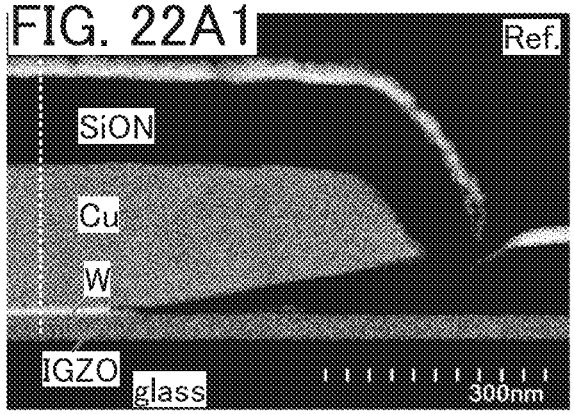
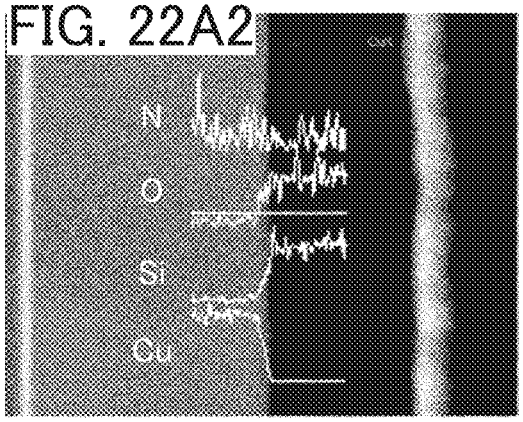
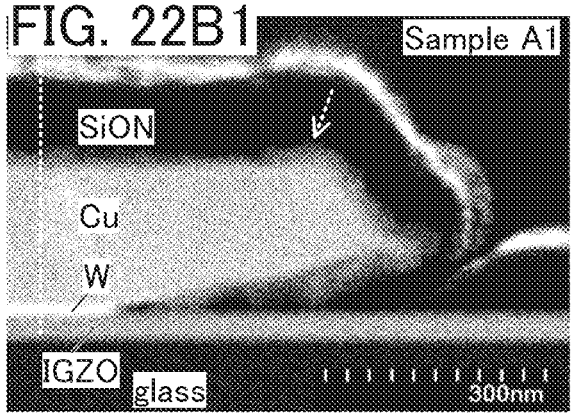
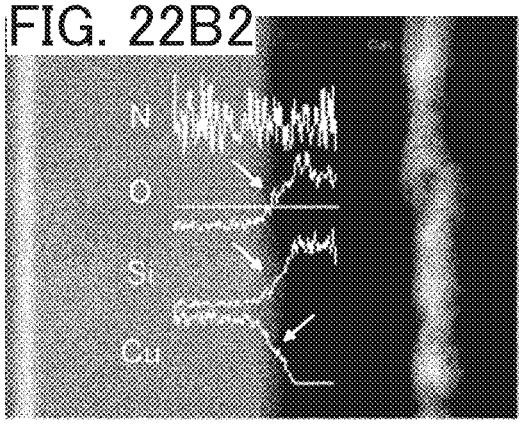
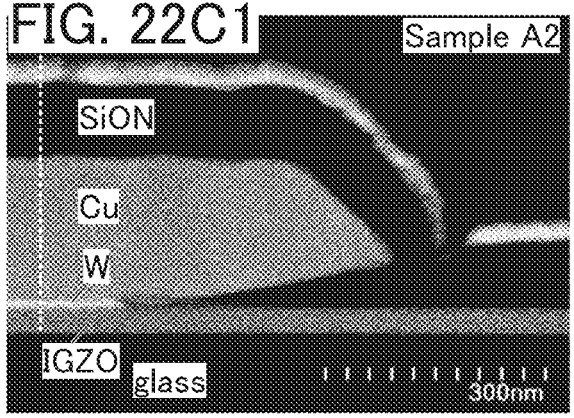
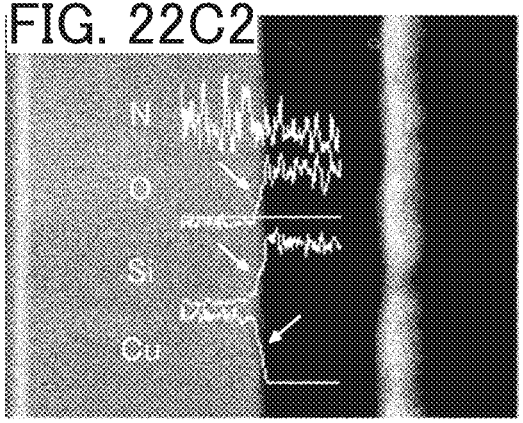
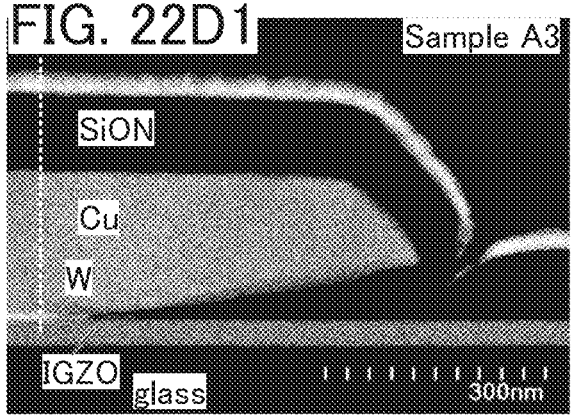
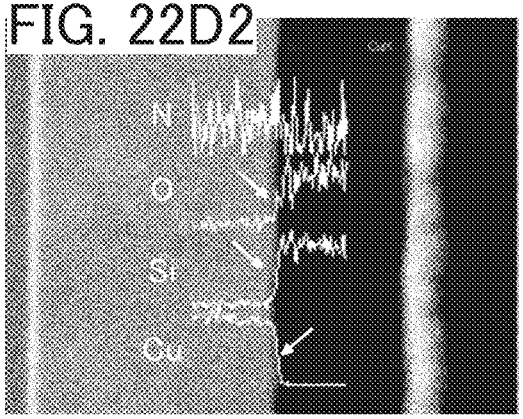

Cu (Auger LMM)

N1s

Sample B1

Sample B2

FABRICATION METHOD OF SEMICONDUCTOR DEVICE

TECHNICAL FIELD

One embodiment of the present invention relates to a semiconductor device and a fabrication method of the semiconductor device. One embodiment of the present invention relates to a transistor and a fabrication method of the transistor.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a fabrication method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility or µFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; thus, a high-performance display device provided with driver circuits can be obtained.

Patent Document 2 discloses a thin film transistor in which an oxide semiconductor film including a low-resistance region containing at least one kind in a group consisting of aluminum, boron, gallium, indium, titanium, silicon, germanium, tin, and lead as a dopant is used for a source region and a drain region.

REFERENCE

Patent Document

[Patent Document 1] Japanese Published Patent Application No. 2014-7399
[Patent Document 2] Japanese Published Patent Application No. 2011-228622

SUMMARY OF THE INVENTION

Problems to be Solved by the Invention

One object of one embodiment of the present invention is to provide a semiconductor device having good electrical characteristics and a fabrication method thereof. Another object is to provide a semiconductor device having stable electrical characteristics and a fabrication method thereof. Another object of one embodiment of the present invention is to provide a highly reliable display device.

Note that the description of these objects does not preclude the existence of other objects. One embodiment of the present invention does not have to achieve all the objects. Note that objects other than these can be derived from the description of the specification, the drawings, the claims, and the like.

Means for Solving the Problems

One embodiment of the present invention is a fabrication method of a semiconductor device, and includes a first step of forming a semiconductor layer containing a metal oxide, a second step of forming a conductive film over the semiconductor layer, a third step of etching the conductive film such that the conductive film is divided over the semiconductor layer and a portion of the semiconductor layer is uncovered, a fourth step of performing first treatment on the conductive film and the portion of the semiconductor layer, and a fifth step of forming a first insulating film containing an oxide to be in contact with the conductive film and the semiconductor layer. The conductive film contains copper, silver, gold, or aluminum. The first treatment is plasma treatment in an atmosphere containing a mixed gas of a first gas containing an oxygen element but not containing a hydrogen element and a second gas containing a hydrogen element but not containing an oxygen element. The first insulating film is formed by a plasma-enhanced chemical vapor deposition method using a film formation gas containing the first gas and a third gas containing a silicon element. The fifth step is successively performed after the fourth step without exposure to the air.

Another embodiment of the present invention is a fabrication method of a semiconductor device, and includes a first step of forming a semiconductor layer containing a metal oxide, a second step of forming a first conductive film, a second conductive film, and a third conductive film in this order over the semiconductor layer, a third step of etching the first conductive film, the second conductive film, and the third conductive film such that the conductive films are divided over the semiconductor layer and a portion of the semiconductor layer and a portion of the second conductive film are uncovered, a fourth step of performing first treatment on the uncovered portion of the second conductive film and the uncovered portion of the semiconductor layer, and a fifth step of forming a first insulating film containing an oxide to be in contact with the second conductive film and the semiconductor layer. The second conductive film contains copper, silver, gold, or aluminum. The first treatment is plasma treatment in an atmosphere containing a mixed gas of a first gas containing an oxygen element but not containing a hydrogen element and a second gas containing a hydrogen element but not containing an oxygen element. The first insulating film is formed by a plasma-enhanced chemical vapor deposition method using a film formation gas containing the first gas and a third gas containing a silicon element. The fifth step is successively performed after the fourth step without exposure to the air.

In the above, it is preferable that the first conductive film and the third conductive film contain an element different from the second conductive film, and each independently contain any of titanium, tungsten, molybdenum, chromium, tantalum, zinc, indium, platinum, and ruthenium.

In the above fourth step, it is preferable that the first treatment be performed with the flow rates of the first gas and the second gas to be supplied to a treatment chamber being controlled such that the flow rate of the second gas is 0.5% to 100% inclusive when the flow rate of the first gas is 100%.

In the above, it is preferable that the first gas contain $N_2O$ or $O_2$. It is preferable that the second gas contain $NH_3$ or $H_2$.

In the above, it is preferable that the fourth step and the fifth step be performed in the same treatment chamber at the same temperature.

In the first step in the above, it is preferable that the semiconductor layer be formed in such a manner that a first metal oxide film and a second metal oxide film are formed in this order, and then the first metal oxide film and the second metal oxide film are processed into an island shape by etching. In this case, it is preferable that the second metal oxide film be formed to have higher crystallinity than the first metal oxide film.

In the above, it is preferable to include a sixth step of forming a first conductive layer before the first step, and a seventh step of forming a second insulating layer covering the first conductive layer between the sixth step and the first step. In this case, it is preferable that in the first step the semiconductor layer be formed to overlap with the first conductive layer.

Effect of the Invention

According to one embodiment of the present invention, a semiconductor device having good electrical characteristics and a fabrication method thereof can be provided. In addition, a semiconductor device having stable electrical characteristics and a fabrication method thereof can be provided. Another embodiment of the present invention can provide a highly reliable display device.

Note that the description of these effects does not preclude the existence of other effects. Note that one embodiment of the present invention need not necessarily have all these effects. Note that effects other than these can be derived from the description of the specification, the drawings, the claims, and the like.

BRIEF DESCRIPTION OF THE DRAWINGS

FIGS. 3A-3C Diagrams illustrating a fabrication method of a transistor.
FIGS. 4A-4C Diagrams illustrating a fabrication method of a transistor.
FIGS. 6A-6B Diagrams illustrating a fabrication method of a transistor.
FIGS. 7A-7D Structure examples of a transistor.
FIGS. 12A-12C Top views of display devices.
FIGS. 22A1-22D2 Cross-sectional views and EDX analyses results related to Example 1.

MODE FOR CARRYING OUT THE INVENTION

Figure 1A:
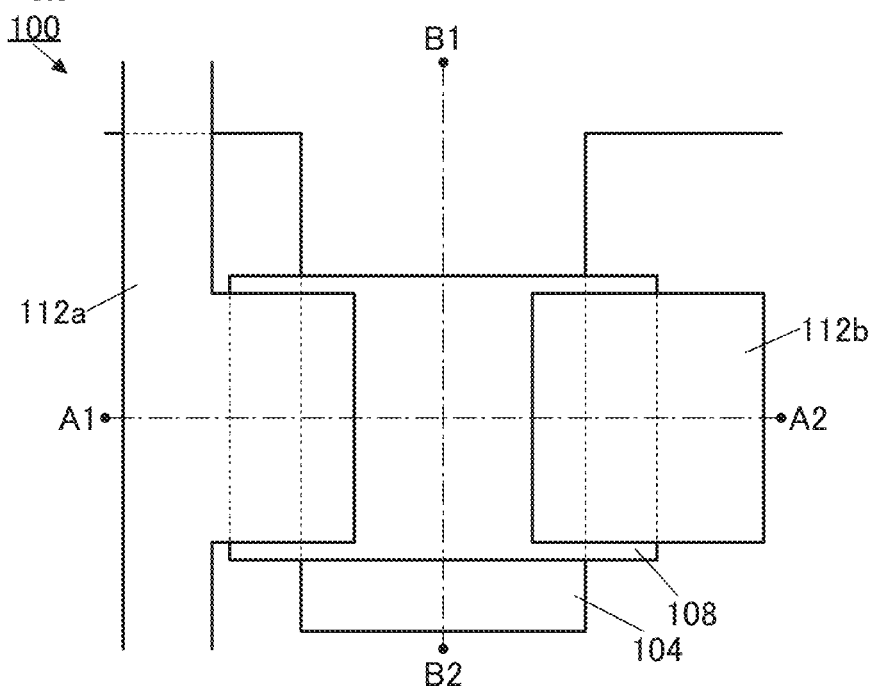
FIGS. 1A-1C A structure example of a transistor.

Hereinafter, embodiments will be described with reference to the drawings. Note that the embodiments can be implemented in many different modes, and it will be readily appreciated by those skilled in the art that modes and details of the embodiments can be changed in various ways without departing from the spirit and scope thereof. Thus, the present invention should not be interpreted as being limited to the following description of the embodiments.

In each drawing described in this specification, the size, the layer thickness, or the region of each component is exaggerated for clarity in some cases.

Ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. Furthermore, the positional relation between components is changed as appropriate in accordance with a direction in which each component is described. Thus, terms for the description are not limited to those used in this specification, and the description can be changed appropriately depending on the situation.

In this specification and the like, functions of a source and a drain of a transistor are sometimes switched from each other depending on the polarity of the transistor, the case where the direction of current flow is changed in circuit operation, or the like. Thus, the terms "source" and "drain" can be used interchangeably.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

Moreover, in this specification and the like, the term "film" and the term "layer" can be interchanged with each other. For example, in some cases, the term "conductive layer" and the term "insulating layer" can be interchanged with the term "conductive film" and the term "insulating film", respectively.

Unless otherwise specified, an off-state current in this specification and the like refers to a drain current of a transistor in an off state (also referred to as a non-conducting state or a cutoff state). Unless otherwise specified, an off state refers to, in an n-channel transistor, a state where the voltage $V_{gs}$ between its gate and source is lower than the threshold voltage $V_{th}$ (in a p-channel transistor, higher than $V_{th}$).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector and an IC are mounted is referred to as a touch panel module, a display module, or simply a touch panel or the like in some cases.

Embodiment 1

In this embodiment, a semiconductor device of one embodiment of the present invention and a fabrication method thereof will be described.

One embodiment of the present invention is a transistor including, over a formation surface, a gate electrode, a gate insulating layer over the gate electrode, a semiconductor layer over the gate insulating layer, and a pair of source and drain electrodes that is in contact with a top surface of the semiconductor layer. The semiconductor layer preferably contains a metal oxide exhibiting semiconductor characteristics (hereinafter also referred to as an oxide semiconductor).

A low-resistance conductive material containing copper, silver, gold, aluminum, or the like is preferably used for the source electrode and the drain electrode. Copper or aluminum is particularly preferable because of its high mass-productivity.

The source electrode and the drain electrode are formed in such a manner that a conductive film is formed to cover the semiconductor layer and then etching is performed such that the conductive film is divided over the semiconductor layer. Right after the formation of the source electrode and the drain electrode, a surface of a channel formation region of the semiconductor layer, which is on the opposite side from the gate electrode (also referred to as a back channel side) is uncovered.

At this time, performing treatment for supplying oxygen to the back channel side of the semiconductor layer can reduce oxygen vacancies in the semiconductor layer, which enables a highly reliable transistor to be obtained. The treatment for supplying oxygen can be heat treatment in an oxygen-containing atmosphere or plasma treatment in an oxygen-containing atmosphere.

However, in the case where the low-resistance conductive material is used for the source electrode and the drain electrode, the treatment for supplying oxygen to the back channel oxidizes the source electrode and the drain electrode to be deprived of conductivity, which adversely affects the electrical characteristics and reliability of the transistor in some cases.

Thus, plasma treatment using a mixed gas of an oxygen-containing gas and a gas having a reducing property is performed as the treatment for supplying oxygen to the back channel. This enables oxygen to be effectively supplied to the back channel while oxidation of the source electrode and the drain electrode is prevented.

More specifically, plasma treatment is performed on the surfaces of the semiconductor layer, the source electrode, and the drain electrode in an atmosphere containing a mixed gas of a first gas containing an oxygen element but not containing a hydrogen element and a second gas containing a hydrogen element but not containing an oxygen element. As the first gas, for example, nitrogen oxide such as $N_2O$ (nitrous oxide or dinitrogen monoxide), $NO_2$ (nitrogen dioxide), or NO (nitric oxide), or a gas containing $O_2$ (oxygen), $O_3$ (ozone), or the like is preferably used. As the second gas, for example, a gas containing $NH_3$ (ammonia), $H_2$ (hydrogen), or the like is preferably used. It is particularly preferable to use, as a mixed gas used for the plasma treatment, a mixed gas containing a rare gas such as Ar in addition to $N_2O$ and $NH_3$.

The ratio of the first gas to the second gas in the mixed gas can be controlled by controlling the flow rate of each gas supplied to the treatment chamber for the plasma treatment. Note that the ratio between two kinds of gases in a mixed gas can be expressed in, for example, the volume ratio, the partial pressure ratio, or the weight ratio. Here, the flow rate ratio between the two kinds of gases supplied to the treatment chamber is substantially the same as the volume ratio and the partial pressure ratio between the two kinds of gases.

Here, when the proportion of the second gas is too low (the flow rate is too small), an oxidation reaction becomes predominant over a reduction reaction, and an oxide is generated on the surfaces of the source electrode and the drain electrode. By contrast, when the proportion of the second gas is too high, an excess hydrogen element in the second gas may diffuse into the back channel side of the semiconductor layer to increase the carrier density in the semiconductor layer. Thus, the flow rate of the second gas is preferably at least lower than or equal to the flow rate of the first gas. Then, the amount of a hydrogen element supplied to the semiconductor layer can be reduced. This is probably because even in the case where the unreacted excess hydrogen element contained in the second gas exist, the excess hydrogen element reacts with an oxygen element contained in the first gas to be released from the treatment chamber in a state of hydroxide.

As for the flow rate ratio between the first gas and the second gas, when the flow rate of the first gas is 100%, the flow rate of the second gas can be 0.5% to 100% inclusive, preferably 1% to 90% inclusive, further preferably 3% to 80% inclusive, still further preferably 3% to 60% inclusive, and still further preferably 3% to 50% inclusive.

It is preferable that, after the above plasma treatment is performed, an insulating film containing an oxide is formed successively without exposure to the air. The formation of the insulating film is preferably conducted by a plasma-enhanced chemical vapor deposition (plasma CVD) method.

At this time, the plasma treatment and the formation of the insulating film are preferably performed successively in the same film formation chamber of the same apparatus. In addition, the plasma treatment and the formation of the insulating film are preferably performed at the same temperature.

As a film formation gas for forming the insulating film containing an oxide, a mixed gas containing a deposition gas containing a silicon element or the like and the first gas used for the above plasma treatment is preferably used. Using the same gas that contains an oxygen element for the plasma treatment and the formation of the insulating film can make the interface between the semiconductor layer and the insulating film favorable. An $N_2O$ gas is used as the first gas, and a mixed gas containing the $N_2O$ gas and an $SiH_4$ (silane) gas is used as the film formation gas, for example, whereby a silicon oxynitride film can be formed.

As the source electrode and the drain electrode, a structure in which the above-mentioned conductive film containing copper, aluminum, or the like and a conductive film containing another metal element are stacked in this order may be employed. Alternatively, a stacked-layer structure of three or more layers in which the conductive film containing copper, aluminum, or the like is sandwiched between conductive films containing another metal element may be employed.

In the case where the source electrode and the drain electrode have a stacked-layer structure, the topmost conductive film preferably contains a material that is less likely to be bonded to oxygen than a conductive film containing copper, aluminum, or the like, or a material that is less likely to be deprived of its conductivity even when being oxidized. In addition, a material into which oxygen in the semiconductor layer is less likely to diffuse is preferably used for the conductive film that is in contact with the semiconductor layer. For the topmost conductive film and the conductive film that is in contact with the semiconductor layer, a conductive material containing titanium, tungsten, molybdenum, chromium, tantalum, zinc, indium, platinum, ruthenium, or the like can be used, for example.

The semiconductor layer preferably has a stacked-layer structure in which two or more metal oxide films with different crystallinity are stacked. It is particularly preferable that a film with higher crystallinity than the other metal oxide films be used as the metal oxide film positioned on the back channel side. In this way, resistance to etching during the formation of the source electrode and the drain electrode can be increased, and the semiconductor layer can be prevented from being lost. Furthermore, resistance to damage during the plasma treatment for supplying oxygen can be increased.

More specific examples will be described below with reference to drawings.

Structure Example

A structure example of a transistor that can be fabricated with use of the fabrication method of a semiconductor device of one embodiment of the present invention will be described below.

Figure 1B:
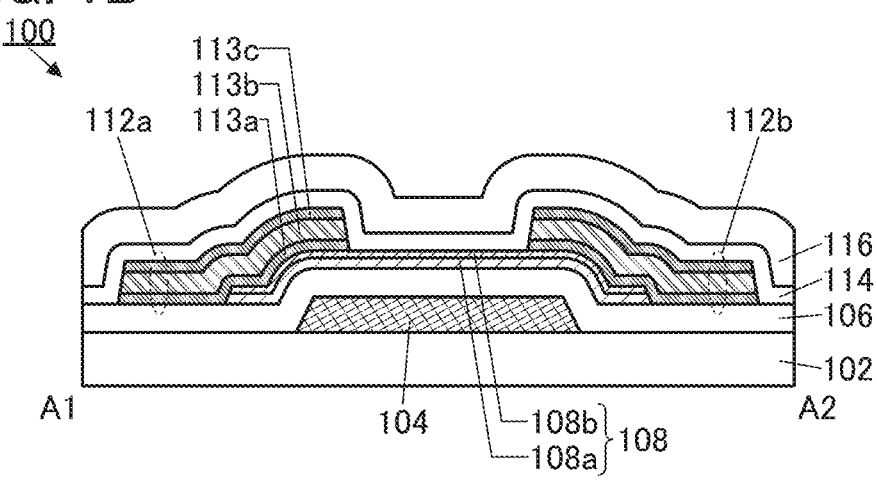
Figure 1C:
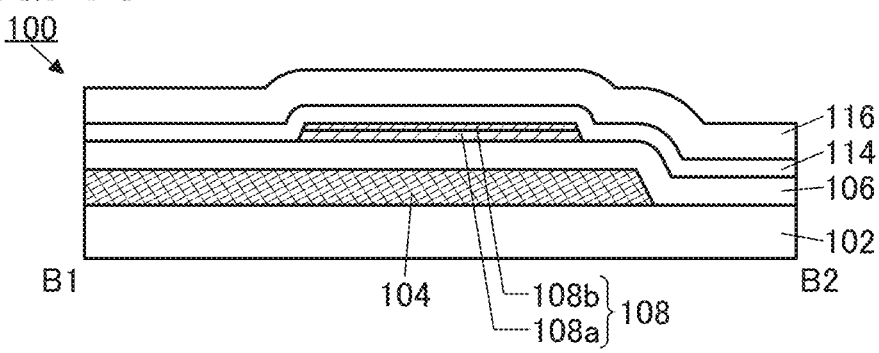

FIG. 1(A) is a top view of a transistor 100, FIG. 1(B) corresponds to a cross-sectional view of a cut plane along the dashed-dotted line A1-A2 in FIG. 1(A), and FIG. 1(C) corresponds to a cross-sectional view of a cut plane along the dashed-dotted line B1-B2 in FIG. 1(A). The direction of the dashed-dotted line A1-A2 corresponds to a channel length direction, and the direction of the dashed-dotted line B1-B2 corresponds to a channel width direction. Note that in FIG. 1(A), some components (e.g., a gate insulating layer) of the transistor 100 are not illustrated. Some components are not illustrated in top views of transistors in the following drawings, as in FIG. 1(A).

The transistor 100 is provided over a substrate 102 and includes a conductive layer 104, an insulating layer 106, a semiconductor layer 108, a conductive layer 112a, a conductive layer 112b, and the like. The insulating layer 106 is provided to cover the conductive layer 104. The semiconductor layer 108 has an island-like shape and is provided over the insulating layer 106. The conductive layer 112a and the conductive layer 112b are each in contact with a top surface of the semiconductor layer 108 and are apart from each other over the semiconductor layer 108. In addition, an insulating layer 114 is provided to cover the insulating layer 106, the conductive layer 112a, the conductive layer 112b, and the semiconductor layer 108; and an insulating layer 116 is provided over the insulating layer 114.

The conductive layer 104 functions as a gate electrode. Part of the insulating layer 106 functions as a gate insulating layer. The conductive layer 112a functions as one of a source electrode or a drain electrode, and the conductive layer 112b functions as the other of the source electrode or the drain electrode. A region of the semiconductor layer 108 that overlaps with the conductive layer 104 functions as a channel formation region. The transistor 100 is what is called a bottom-gate transistor, in which the gate electrode is provided more on the formation surfaces side than the semiconductor layer 108. Here, a side of the semiconductor layer 108 opposite to the conductive layer 104 side is sometimes referred to as a back channel side. The transistor 100 has what is called a channel-etched structure in which no protective layer is provided between the back channel side of the semiconductor layer 108 and the source and drain electrodes.

The semiconductor layer 108 has a stacked-layer structure in which a semiconductor layer 108a and a semiconductor layer 108b are stacked in this order from the formation surface side (substrate 102 side). Each of the semiconductor layer 108a and the semiconductor layer 108b preferably contains a metal oxide. The semiconductor layer 108b, which is positioned on the back channel side, preferably has higher crystallinity than the semiconductor layer 108a, which is positioned on the conductive layer 104 side. With this structure, the semiconductor layer 108 can be prevented from being partly etched and lost at the time of processing of the conductive layer 112a and the conductive layer 112b.

The semiconductor layer 108 preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably aluminum, gallium, yttrium, or tin.

It is particularly preferable to use an oxide containing indium, gallium, and zinc for the semiconductor layer 108.

As the semiconductor layer 108a and the semiconductor layer 108b, layers with different compositions, layers with different crystallinity, or layers with different impurity concentrations may be used. A stacked-layer structure of three or more layers may also be employed.

The conductive layer 112a and the conductive layer 112b each have a stacked-layer structure in which a conductive layer 113a, a conductive layer 113b, and a conductive layer 113c are stacked in this order from the formation surface side.

The conductive layer 113b is preferably formed using a low-resistance conductive material containing copper, silver, gold, aluminum, or the like. It is particularly preferable that the conductive layer 113b contain copper or aluminum. For the conductive layer 113b, a conductive material having resistance lower than those of the conductive layer 113a and the conductive layer 113c is preferably used. In that case, the conductive layer 112a and the conductive layer 112b can have extremely low resistance.

The conductive layer 113a and the conductive layer 113c can be each independently formed using a conductive material different from that of the conductive layer 113b. For example, the conductive layer 113a and the conductive layer 113c can be each independently formed using a conductive material containing titanium, tungsten, molybdenum, chromium, tantalum, zinc, indium, platinum, ruthenium, or the like.

When the conductive layer 113b containing copper, aluminum, or the like is sandwiched between the conductive layer 113a and the conductive layer 113c as described above, it is possible to prevent oxidation of a surface of the conductive layer 113b and diffusion of an element contained in the conductive layer 113b into neighboring layers. Specifically, provision of the conductive layer 113a between the semiconductor layer 108 and the conductive layer 113b can prevent diffusion of a metal element contained in the conductive layer 113a into the semiconductor layer 108, thereby enabling the transistor 100 to have high reliability.

Here, the insulating layer 114 is provided in contact with an end portion of the conductive layer 113b. According to one embodiment of the present invention, even when a conductive material that is easily oxidized is used for the conductive layer 113b and the insulating layer 114 that includes an oxide film is formed over the conductive layer 113b, a surface of the conductive layer 113b can be prevented from being oxidized, as described later. Thus, another layer that contains an oxide or the like is not observed at the interface between the conductive layer 113b and the insulating layer 114, which is one of the features of one embodiment of the present invention.

Note that the structure of the conductive layer 112a and the conductive layer 112b is not limited to a three-layer structure and may be a two-layer structure or a four-layer structure including a conductive layer containing copper, silver, gold, or aluminum. For example, the conductive layer 112a and the conductive layer 112b may each have a two-layer structure in which the conductive layer 113a and the conductive layer 113b are stacked or a two-layer structure in which the conductive layer 113b and the conductive layer 113c are stacked.

For the conductive layer 104, any of the above conductive materials that can be used for the conductive layer 113a and the conductive layer 113b can be appropriately used. The use of a conductive material containing copper is particularly preferable.

For the insulating layer 106 and the insulating layer 114 that are in contact with the semiconductor layer 108, an insulating material containing an oxide is preferably used. In the case where the insulating layer 106 or the insulating layer 114 has a stacked-layer structure, an insulating material containing an oxide is used for a layer in contact with the semiconductor layer 108.

For the insulating layer 106, a nitride insulating film of silicon nitride, aluminum nitride, or the like may be used. In the case where an insulating material containing no oxide is used, treatment for adding oxygen to an upper portion of the insulating layer 106 is preferably performed to form an oxygen-containing region. Examples of the treatment for adding oxygen include heat treatment or plasma treatment in an oxygen-containing atmosphere, and an ion doping treatment.

The insulating layer 116 functions as a protective layer protecting the transistor 100. For the insulating layer 116, an inorganic insulating material such as silicon nitride, silicon nitride oxide, silicon oxide, silicon oxynitride, aluminum oxide, or aluminum nitride can be used. It is particularly preferable that a material less likely to diffuse oxygen, such as silicon nitride or aluminum oxide, be used for the insulating layer 116, in which case release of oxygen from the semiconductor layer 108 or the insulating layer 114 to the outside through the insulating layer 116 due to heat applied during the fabrication process or the like can be prevented.

For the insulating layer 116, an organic insulating material that can function as a planarization film may be used. Alternatively, a stacked-layer film that includes a film containing an inorganic insulating material and a film containing an organic insulating material may be used as the insulating layer 116.

In the semiconductor layer 108, a pair of low-resistance regions, which are positioned in portions in contact with the conductive layer 112a and the conductive layer 112b and in the vicinity thereof and function as a source region and a drain region, may be formed. The regions are part of the semiconductor layer 108 and have lower resistance than the channel formation region. The low-resistance regions can also be referred to as regions with high carrier density, n-type regions, or the like. In the semiconductor layer 108, a region that is sandwiched between the pair of low-resistance regions and overlaps with the conductive layer 104 functions as a channel formation region.

The above is the description of Structure example 1.

Structure Example 2

A transistor structure example that is partly different from Structure example 1 shown above will be described below. Note that description of the same portions as those in Structure example 1 shown above will be omitted below in some cases. Furthermore, in drawings that are referred to later, the same hatching pattern is applied to portions having functions similar to those in the above structure example, and the portions are not denoted by reference numerals in some cases.

Figure 2A:
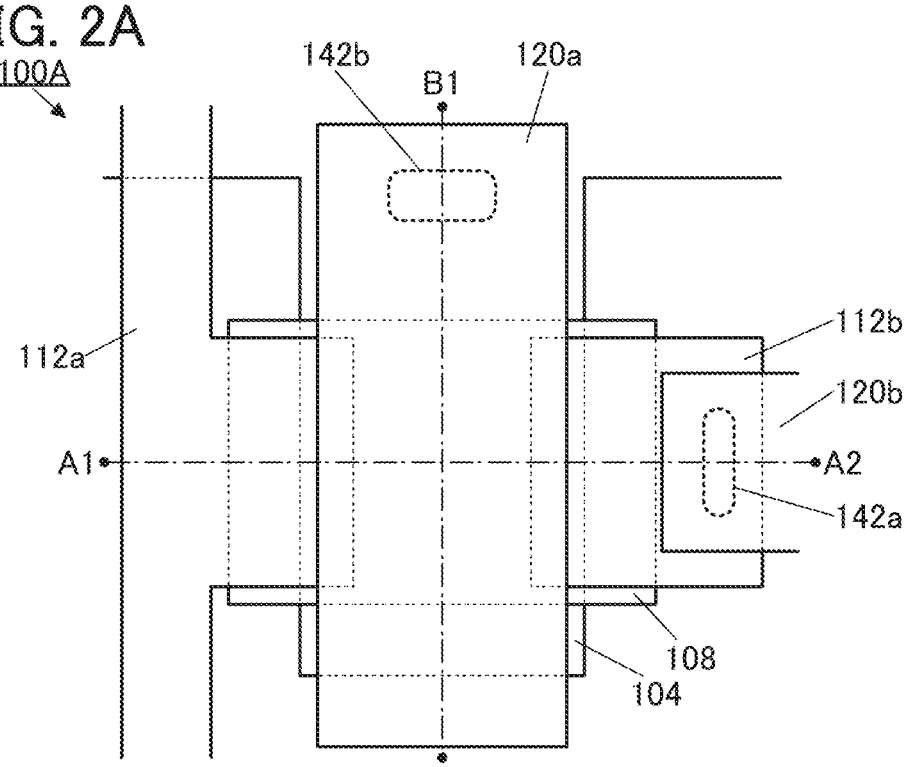
FIGS. 2A-2C A structure example of a transistor.
Figure 2B:
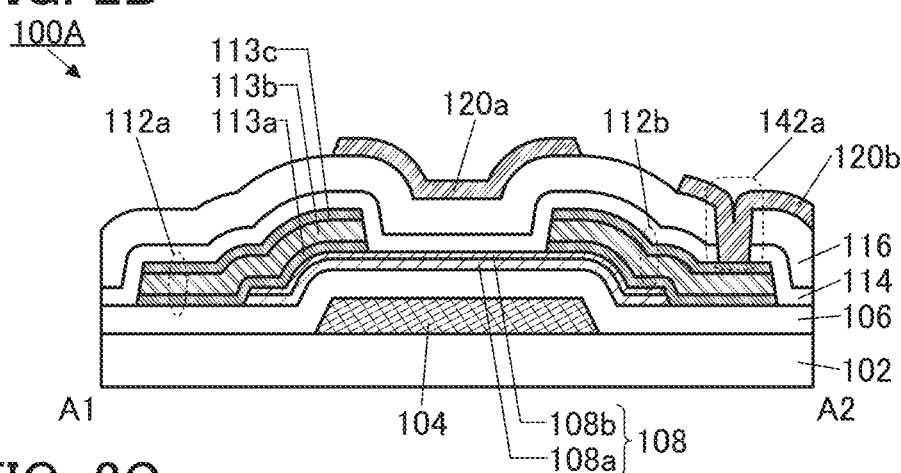
Figure 2C:
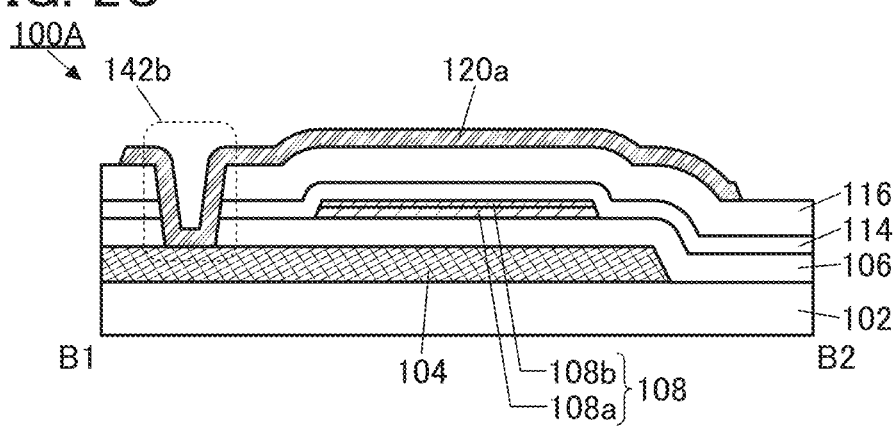

FIG. 2(A) is a top view of a transistor 100A, FIG. 2(B) is a cross-sectional view of the transistor 100B in the channel length direction, and FIG. 2(C) is a cross-sectional view in the channel width direction.

The transistor 100A is different from Structure example 1 mainly in that a conductive layer 120a and a conductive layer 120b are provided over the insulating layer 116.

The conductive layer 120a includes a region overlapping with the semiconductor layer 108 with the insulating layer 116 and the insulating layer 114 therebetween.

In the transistor 100A, the conductive layer 104 has a function of a first gate electrode (also referred to as a bottom gate electrode), and the conductive layer 120a has a function of a second gate electrode (also referred to as a top gate electrode). A portion of the insulating layer 116 and insulating layer 114 functions as a second gate insulating layer.

As illustrated in FIGS. 2(A) and 2(C), the conductive layer 120a may be electrically connected to the conductive layer 104 through an opening 142b provided in the insulating layer 116, the insulating layer 114, and the insulating layer 106. In this way, the same potential can be supplied to the conductive layer 120a and the conductive layer 104, which enables a transistor having high on-state current to be provided.

As illustrated in FIGS. 2(A) and 2(C), the conductive layer 104 and the conductive layer 120a preferably extend beyond an end portion of the semiconductor layer 108 in the channel width direction. In that case, as illustrated in FIG. 2(C), the semiconductor layer 108 in the channel width direction is entirely surrounded by the conductive layer 104 and the conductive layer 120a.

With such a structure, the semiconductor layer 108 can be electrically surrounded by electric fields generated by a pair of gate electrodes. In that case, it is particularly preferable that the same potential be supplied to the conductive layer 104 and the conductive layer 120a. In this way, electric fields for inducing a channel can be effectively applied to the semiconductor layer 108, whereby the on-state current of the transistor 100A can be increased. Thus, the transistor 100A can also be miniaturized.

Note that a structure in which the conductive layer 104 and the conductive layer 120a are not connected to each other may be employed. In that case, a constant potential may be supplied to one of the pair of gate electrodes, and a signal for driving the transistor 100A may be supplied to the other. In this case, the potential supplied to one of the electrodes can control the threshold voltage at the time of driving the transistor 100A with the other electrode.

The conductive layer 120b is electrically connected to the conductive layer 112b through an opening 142a provided in the insulating layer 116 and the insulating layer 114. The conductive layer 120b can be used as a wiring or an electrode. When used in a display device, the conductive layer 120b can function as a pixel electrode or a wiring for connection to a pixel electrode.

The above is the description of Structure example 2.

Fabrication Method Example

Next, a method for fabricating the semiconductor device of one embodiment of the present invention will be described with reference to drawings. Here, description will be made giving, as an example, the transistor 100A described above in Structure example 2.

Note that thin films that constitute the semiconductor device (insulating films, semiconductor films, conductive films, and the like) can be formed by a sputtering method, a chemical vapor deposition (CVD) method, a vacuum evaporation method, a pulse laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that constitute the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, and the thin film is processed into a desired shape.

For light for exposure in a photolithography method, an i-line (with a wavelength of 365 nm), a g-line (with a wavelength of 436 nm), an h-line (with a wavelength of 405 nm), or combined light of any of them can be used, for example. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case where exposure is performed by scanning of a beam such as an electron beam, a photomask is not needed.

For etching of the thin film, a dry etching method, a wet etching method, a sandblast method, or the like can be used.

FIG. 3 to FIG. 6 are drawings illustrating a method for fabricating the transistor 100A. In each drawing, a cross section in the channel length direction is shown on the left side, and a cross section in the channel width direction is shown on the right side.

Formation of Conductive Layer 104

A conductive film is formed over the substrate 102, a resist mask is formed by a lithography process over the conductive film, and then the conductive film is etched, whereby the conductive layer 104 functioning as a gate electrode is formed.

Formation of Insulating Layer 106

Next, the insulating layer 106 covering the conductive layer 104 and the substrate 102 is formed (FIG. 3(A)). The insulating layer 106 can be formed by a PECVD method or the like, for example.

After the formation of the insulating layer 106, treatment for supplying oxygen to the insulating layer 106 may be performed. As the oxygen supply treatment, an oxygen radical, an oxygen atom, an oxygen atomic ion, an oxygen molecular ion, or the like is supplied to the insulating layer 106 by an ion doping method, an ion implantation method, plasma treatment, or the like. Alternatively, a film that suppresses oxygen release may be formed over the insulating layer 106, and then oxygen may be added to the insulating layer 106 through the film. It is preferable to remove the film after addition of oxygen. As the above film that suppresses oxygen release, a conductive film or a semiconductor film containing one or more of indium, zinc, gallium, tin, aluminum, chromium, tantalum, titanium, molybdenum, nickel, iron, cobalt, and tungsten can be used.

Furthermore, before the treatment for supplying oxygen, heat treatment for releasing water or hydrogen from the surface and inside of the insulating layer 106 may be performed. For example, the heat treatment can be performed in a nitrogen atmosphere at a temperature higher than or equal to 300° C. and lower than the heat resistant temperature of the conductive layer 104, preferably at 300° C. to 450° C. inclusive.

Formation of Semiconductor Layer 108

Next, a metal oxide film 108af and a metal oxide film 108bf are formed to be stacked over the insulating layer 106 (FIG. 3(B)).

The metal oxide film 108af and the metal oxide film 108bf are each preferably formed by a sputtering method using a metal oxide target.

In forming the metal oxide film 108af and the metal oxide film 108bf, an inert gas (e.g., a helium gas, an argon gas, or a xenon gas) may be mixed in addition to the oxygen gas. Note that the proportion of the oxygen gas in the whole film formation gas (hereinafter also referred to as an oxygen flow rate ratio) in forming the metal oxide film can be in the range of 0% to 100% inclusive.

When a metal oxide film with relatively low crystallinity is formed with a low oxygen flow rate ratio, a metal oxide film having high conductivity can be obtained. By contrast, when a metal oxide film with relatively high crystallinity is formed with a high oxygen flow rate ratio, a metal oxide film having high resistance to etching and electrical stability can be obtained.

Here, the metal oxide film 108af positioned on the conductive layer 104 (functioning as a gate electrode) side is a film with low crystallinity whereas the metal oxide film 108bf positioned on the back channel side is a film with low crystallinity, which enables a transistor with high reliability and high electric field-effect mobility to be provided.

The metal oxide film 108af and the metal oxide film 108bf are formed under the film formation conditions where a substrate temperature is higher than or equal to room temperature and lower than or equal to 200° C., preferably higher than or equal to room temperature and lower than or equal to 140° C., for example. The substrate temperature during formation of the metal oxide film is preferably, for example, higher than or equal to room temperature and lower than 140° C. because the productivity is increased.

More specifically, the oxygen flow rate ratio during formation of the metal oxide film 108af is higher than or equal to 0% and lower than 50%, preferably 0% to 30% inclusive, further preferably 0% to 20% inclusive, typically 10%. The oxygen flow rate ratio during formation of the metal oxide film 108bf is 50% to 100% inclusive, preferably 60% to 100% inclusive, further preferably 80% to 100% inclusive, still further preferably 90% to 100% inclusive, typically 100%. Furthermore, although conditions during the film formation, such as pressure, temperature, or power, may vary between the metal oxide film 108af and the metal oxide film 108bf, it is preferable to employ the same conditions other than the oxygen flow rate ratio because the time required for the film formation step can be shortened.

Note that the metal oxide film 108af and the metal oxide film 108bf may be films with different compositions from each other. In that case, when an In—Ga—Zn oxide is used for both the metal oxide film 108af and the metal oxide film 108bf, an oxide target in which the proportion of the contained In is higher than that in the metal oxide film 108af is preferably used for the metal oxide film 108bf.

After the formation of the metal oxide film 108af and the metal oxide film 108bf, a resist mask is formed over the metal oxide film 108bf, the metal oxide film 108af and the metal oxide film 108bf are processed by etching, and then, the resist mask is removed; whereby the island-shaped semiconductor layer 108 in which the semiconductor layer 108a and the semiconductor layer 108b are stacked can be formed (FIG. 3(C)).

Formation of Conductive Layer 112a and Conductive Layer 112b

Next, a conductive film 113af, a conductive film 113bf, and a conductive film 113cf covering the insulating layer 106 and the semiconductor layer 108 are formed to be stacked (FIG. 4(A)).

The conductive film 113bf is a film to be the conductive layer 113b later and preferably contains copper, silver, gold, or aluminum. The conductive film 113af and the conductive film 113cf are films to be the conductive layer 113a and the conductive layer 113b later, respectively, and each preferably contain titanium, tungsten, molybdenum, chromium, tantalum, zinc, indium, platinum, ruthenium, or the like.

The conductive film 113af, the conductive film 113bf, and the conductive film 113cf are preferably formed by a film formation method such as a sputtering method, an evaporation method, or a plating method.

Next, a resist mask is formed over the conductive film 113cf, and the conductive film 113cf, the conductive film 113bf, and the conductive film 113af are etched; whereby the conductive layer 112a and the conductive layer 112b each having a structure in which the conductive layer 113a, the conductive layer 113b, and the conductive layer 113c are stacked can be formed (FIG. 4(B)).

The conductive layer 112a and the conductive layer 112b are preferably processed to be apart from each other over a channel formation region of the semiconductor layer 108, as illustrated in FIG. 4(B). In other words, the conductive layer 112a and the conductive layer 112b are preferably processed such that the end portion of the conductive layer 112a and the end portion of the conductive layer 112b, which are opposite each other, overlap with both the conductive layer 104 and the semiconductor layer 108. In this way, the on-state current of the transistor can be increased.

The conductive film 113cf, the conductive film 113bf, and the conductive film 113af can each be etched by wet etching, dry etching, or the like. The three layers can be etched at a time in one step, or each of the three layers may be sequentially etched in a different process.

Plasma Treatment

Next, plasma treatment in a mixed gas atmosphere of an oxygen-containing gas and a gas having a reducing property is performed to supply oxygen from the back channel side to the semiconductor layer 108.

FIG. 4(C) schematically illustrates a state in which the surfaces of the semiconductor layer 108, the conductive layer 112a, and the insulating layer 106 are exposed to plasma 130.

As the mixed gas, a mixed gas of the first gas containing an oxygen element but not containing a hydrogen element and the second gas containing a hydrogen element but not containing an oxygen element is preferably used. As the first gas having an oxidizing property, nitrogen oxide such as $N_2O$ (nitrous oxide or dinitrogen monoxide), $NO_2$ (nitrogen dioxide), or NO (nitric oxide), or a gas containing $O_2$ (oxygen), $O_3$ (ozone), or the like is preferably used, for example. As the second gas having a reducing property, for example, a gas containing $NH_3$ (ammonia), $H_2$ (hydrogen), or the like is preferably used. It is particularly preferable to use, as a mixed gas used for the plasma treatment, a mixed gas containing $N_2O$, $NH_3$, and a rare gas. As an example of the rare gas, Ar or the like can be given.

The ratio of the first gas to the second gas in the mixed gas can be controlled by controlling the flow rate of each gas when supplied to the treatment chamber for the plasma treatment. The flow rate ratio of the first gas to the second gas in the mixed gas can be set in accordance with how easily the conductive layer 113a, the conductive layer 113b, and the conductive layer 113c are oxidized, and the flow rate of the second gas is preferably at least lower than or equal to the flow rate of the first gas. When the flow rate of the second gas is much lower than the flow rate of the first gas, oxidation of the surface of the conductive layer 113b and the like becomes predominant, and an oxide is likely to be formed on the surface. By contrast, when the flow rate of the second gas is much higher than the flow rate of the first gas, the surface of the semiconductor layer 108 might be reduced, and hydrogen might be supplied into the semiconductor layer 108.

When the flow rate of the first gas is 100%, the flow rate of the second gas can be 0.5% to 100% inclusive, preferably 1% to 90% inclusive, further preferably 3% to 80% inclusive, still further preferably 3% to 60% inclusive, and still further preferably 3% to 50% inclusive, for example.

Figure 5A:
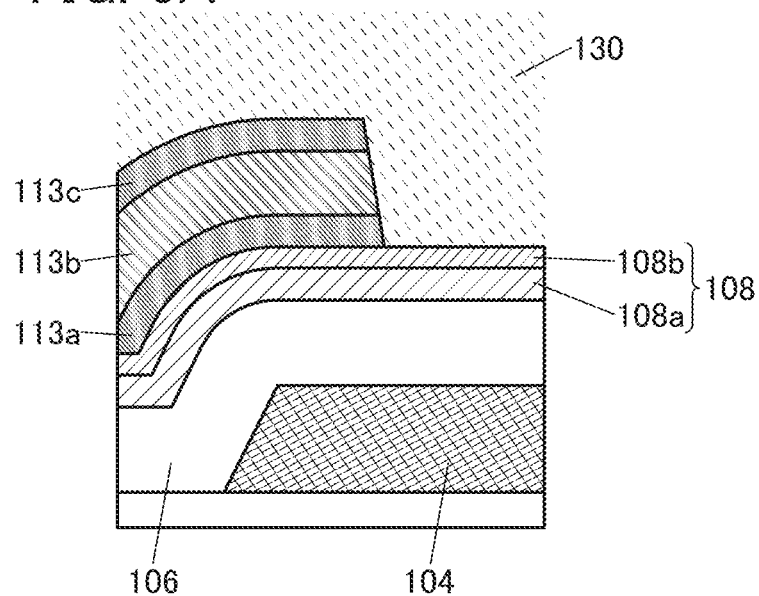
FIGS. 5A-5B Diagrams illustrating a fabrication method of a transistor.

FIG. 5(A) shows an enlarged view of end portions of the conductive layer 113a, the conductive layer 113b, and the conductive layer 113c, which constitute the conductive layer 112a over the semiconductor layer 108, and their vicinity in FIG. 4(C). When the uncovered surface of the semiconductor layer 108b is exposed to the plasma 130, activated oxygen radicals, oxygen atoms, oxygen atomic ions, oxygen molecular ions, or the like are supplied to the semiconductor layer 108b.

At this time, the surfaces of the conductive layer 113c, the conductive layer 113b, and the conductive layer 113a are also exposed to the plasma 130. Since the gas used for the plasma treatment contains the second gas having a reducing property, however, even when the surface is oxidized, the oxidized surface is reduced right away. As a result, the formation of an oxide film on the surfaces of the conductive layer 113c, the conductive layer 113b, and the conductive layer 113a is prevented. Thus, even in the case where a material that is easily oxidized such as copper or aluminum is used for the conductive layer 113b, for example, oxygen can be effectively supplied to the semiconductor layer 108 while oxidation of the conductive layer 113b is prevented.

Figure 5B:
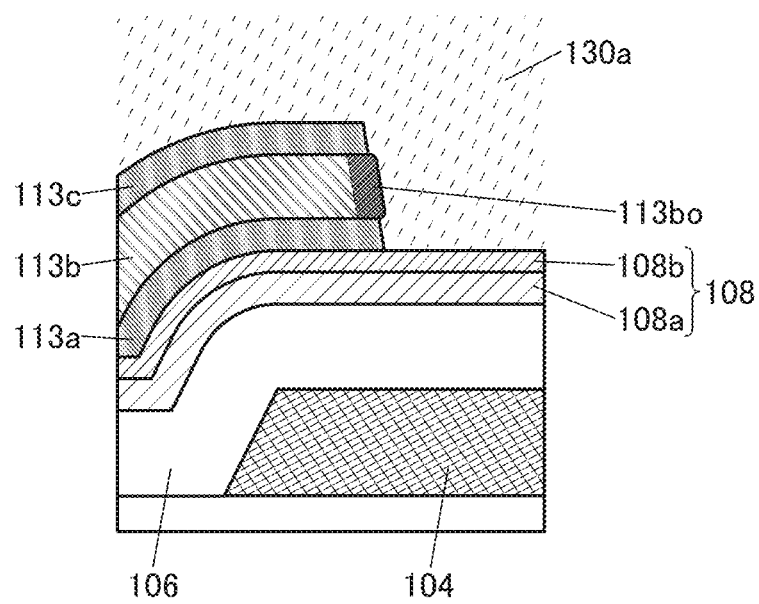

FIG. 5(B) shows an example in which a gas used for the plasma treatment does not contain a gas having a reducing property. In this case, an oxide 113bo is formed on a portion of the conductive layer 113b exposed to the plasma 130a. In the case where a material that is easily oxidized is used also for the conductive layer 113a and the conductive layer 113c, an oxide is formed also on their surfaces. The oxide 113bo or the like formed on the surface of the conductive layer 113b in this manner might contaminate the surface of the semiconductor layer 108b when a portion thereof is scattered during the plasma treatment or in the later formation of the insulating layer 114. The oxide attached to the semiconductor layer 108b can function as a donor or an acceptor, which might adversely affect the electrical characteristics or reliability of the transistor. In the case where a copper element diffuses into the semiconductor layer 108, for example, the copper element functions as a carrier trap and might degrade the electrical characteristics or reliability of the transistor.

By contrast, in one embodiment of the present invention, even when the surfaces of the conductive layer 113c, the conductive layer 113b, and the conductive layer 113a, especially the side surface of the conductive layer 113b, are uncovered during the plasma treatment for supplying oxygen to the semiconductor layer 108, oxidation of the surfaces can be prevented. Thus, the back channel of the semiconductor layer 108 can be prevented from being contaminated, and a highly reliable transistor can be provided.

Formation of Insulating Layer 114

Next, the insulating layer 114 is formed to cover the conductive layer 112a, the conductive layer 112b, the semiconductor layer 108, and the insulating layer 106.

The insulating layer 114 is preferably deposited in, for example, an atmosphere containing oxygen. It is particularly preferable that the insulating layer 114 be formed by a plasma CVD method in an atmosphere containing oxygen. Thus, the insulating layer 114 with few defects can be formed.

As the insulating layer 114, for example, an oxide film such as a silicon oxide film or a silicon oxynitride film is preferably formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having a small amount of defects can be formed as the insulating layer 114 with the PECVD apparatus in which the flow rate of the oxidizing gas is more than 20 times and less than 100 times, or more than or equal to 40 times and less than or equal to 80 times the flow rate of the deposition gas and the pressure in a treatment chamber is lower than 100 Pa or lower than or equal to 50 Pa.

The insulating layer 114 may be formed by a PECVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and power can be used for dissociation and ionization of more molecules; thus, plasma with a high density (high-density plasma) can be excited. Thus, little plasma damage to the deposition surface and a deposit is caused, so that the insulating layer 114 having few defects can be formed.

Here, it is preferable that the insulating layer 114 be formed successively after the above plasma treatment without exposure of the substrate 102 to the air. The plasma treatment is preferably performed in the apparatus for forming the insulating layer 114, for example. In that case, the plasma treatment is preferably performed in the film formation chamber where the insulating layer 114 is formed. Alternatively, a structure may be employed in which the plasma treatment is performed in a treatment chamber connected to the film formation chamber via a gate valve or the like and then the substrate is transferred to the film formation chamber for the insulating layer 114 without exposure to the air and under a reduced pressure. In the case where the plasma treatment and the formation of the insulating layer 114 are successively performed in the same film formation chamber of the same apparatus, the plasma treatment and the formation of the insulating layer 114 are preferably performed at the same temperature.

In that case, it is preferable to use a mixed gas containing the first gas with an oxidizing property that is used for the plasma treatment and a deposition gas containing a silicon element or the like as the film formation gas for forming the insulating layer 114 containing an oxide. Thus, the interface between the semiconductor layer and the insulating film can be favorable. A silicon oxynitride film can be formed, for example, using an $N_2O$ gas as the first gas, and using a mixed gas containing the $N_2O$ gas and an $SiH_4$ (silane) gas as the film formation gas.

After the formation of the insulating layer 114, treatment for supplying oxygen to the insulating layer 114 may be performed. As the treatment for supplying oxygen, a method similar to that for the insulating layer 106 can be used.

Formation of Insulating Layer 116

Next, the insulating layer 116 is formed to cover the insulating layer 114 (FIG. 6(A)).

For the insulating layer 116, an insulating film that less easily diffuses oxygen, hydrogen, water, or the like than the insulating layer 114 is preferably used. With the insulating layer 116 that less easily diffuses oxygen, oxygen in the semiconductor layer 108 can be prevented from being released to the outside through the insulating layer 114. Furthermore, with the insulating layer 116 that less easily diffuses hydrogen; hydrogen, water, or the like from the outside can be prevented from diffusing into the semiconductor layer 108 or the like.

Formation of Conductive Layer 120a and Conductive Layer 120b

Next, the insulating layer 116 and the insulating layer 114 are partly etched, whereby the opening 142a reaching the conductive layer 112b and the opening 142b reaching the conductive layer 104 are formed.

Then, after a conductive film is formed to cover the opening 142a and the opening 142b, the conductive film is processed, whereby the conductive layer 120a and the conductive layer 120b can be formed (FIG. 6(B)).

Through the above process, the transistor 100A can be fabricated.

According to the fabrication method of a transistor described here, the treatment for supplying oxygen into the back channel of the semiconductor layer can be performed while oxidation of the source electrode and the drain electrode is prevented; thus, a transistor with good electrical characteristics and high reliability can be fabricated.

The above is the description of the fabrication method example of the transistor.

Modification Example of Structure Example

A modification example of the structure example of a transistor described above will be described below.

Modification Example 1

A transistor 100B illustrated in FIGS. 7(A) and 7(B) is different from the transistor 100 described in Structure example 1 shown above in that the semiconductor layer 108 does not have a stacked-layer structure.

When the semiconductor layer 108 has a single-layer structure, the fabrication process can be simplified and the productivity can be improved. In this case, it is preferable to use a metal oxide film having crystallinity as the semiconductor layer 108.

Modification Example 2

A transistor 100C illustrated in FIGS. 7(C) and 7(D) is different from the transistor 100 described in Structure example 1 shown above in that not only the semiconductor layer 108 but also the conductive layer 112a and the conductive layer 112b do not have a stacked-layer structure.

When the conductive layer 112a and the conductive layer 112b, in addition to the semiconductor layer 108, each have a single-layer structure, productivity can be further improved.

For the conductive layer 112a and the conductive layer 112b, a conductive material containing copper, silver, gold, or aluminum is preferably used. According to the fabrication method of one embodiment of the present invention, oxidation of the conductive layer 112a and the conductive layer 112b can be prevented in the treatment for supplying oxygen into the semiconductor layer 108; thus, even when a conductive layer containing copper or the like is used as a single layer in this way, a highly reliable transistor can be obtained.

Modification Example 3

Figure 8A:
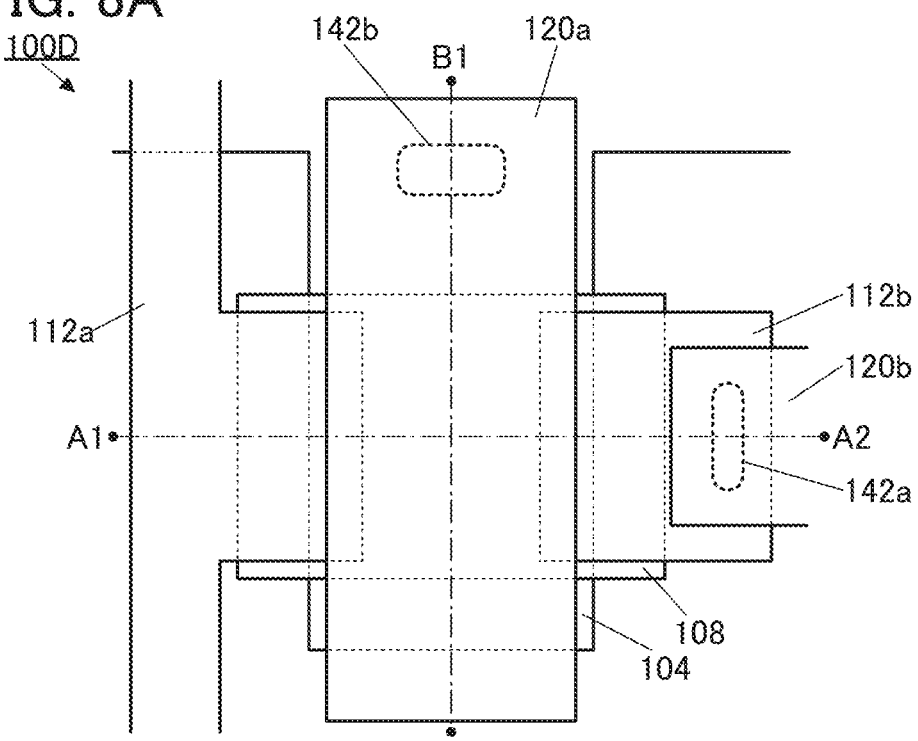
FIGS. 8A-8C A structure example of a transistor.
Figure 8B:
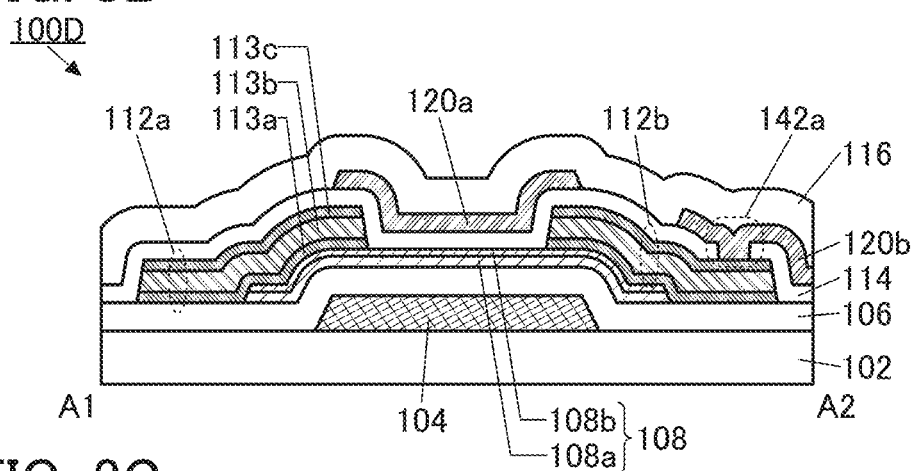
Figure 8C:
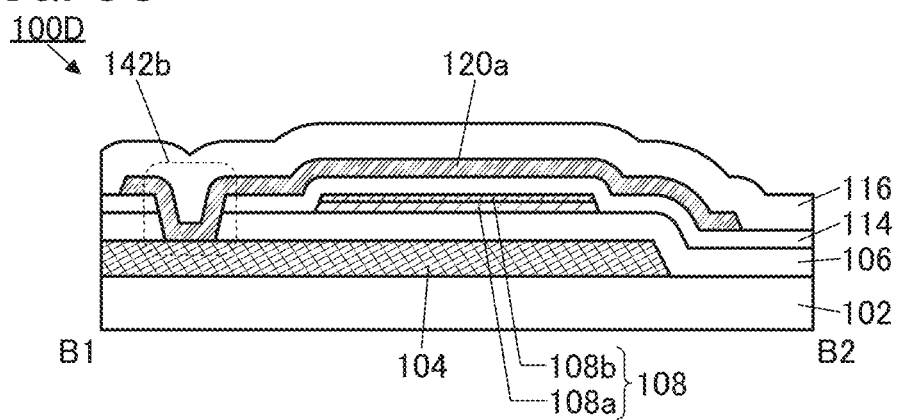

A transistor 100D illustrated in FIGS. 8(A), 8(B), and 8(C) is different from the transistor 100A described in Structure example 2 shown above mainly in the positions of the conductive layer 120a and the conductive layer 120b.

The conductive layer 120a and the conductive layer 120b are positioned between the insulating layer 114 and the insulating layer 116. The conductive layer 120b is electrically connected to the conductive layer 112b through the opening 142a provided in the insulating layer 114.

With such a structure, the distance between the conductive layer 120a and the semiconductor layer 108 can be shortened, and thus the electrical characteristics of the transistor 100D can be improved.

Modification Example 4

Figure 9A:
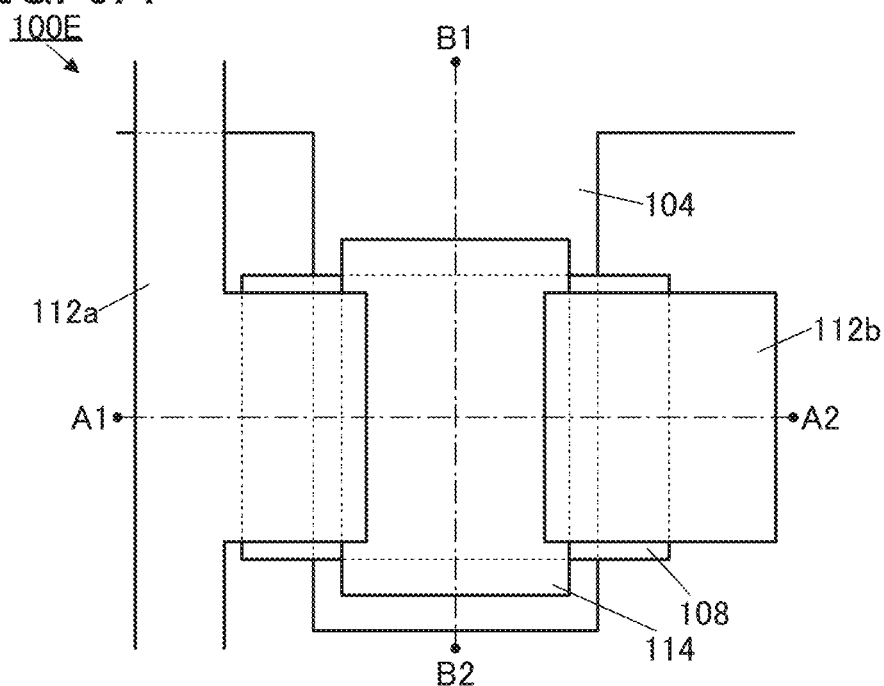
FIGS. 9A-9C Structure examples of a transistor.
Figure 9B:
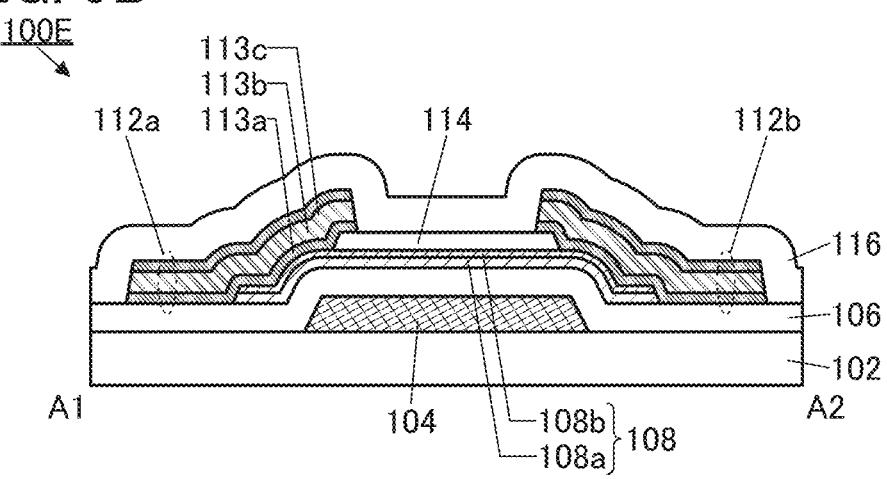
Figure 9C:
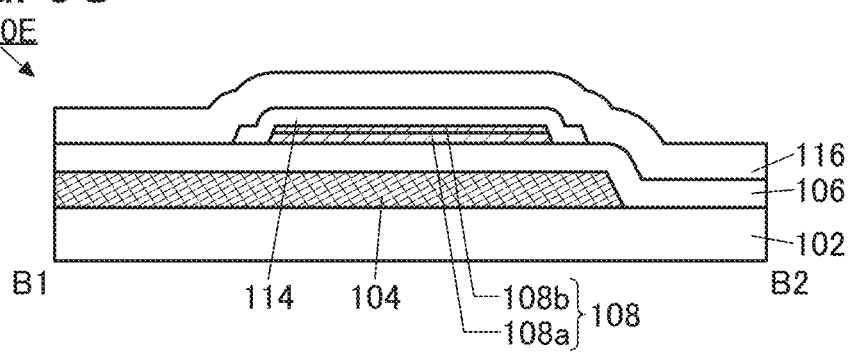

A transistor 100E illustrated in FIGS. 9(A), 9(B), and 9(C) is different from the transistor 100 described in Structure example 1 shown above, mainly in the structure of the insulating layer 114.

The insulating layer 114 is processed into an island shape that covers a channel formation region of the semiconductor layer 108. Furthermore, the end portions of the conductive layer 112a and the conductive layer 112b, which are positioned over the semiconductor layer 108, are positioned over the insulating layer 114. Thus, the insulating layer 114 functions as a so-called channel protective layer, and can protect the back channel side of the semiconductor layer 108 when the conductive layer 112a and the conductive layer 112b are etched.

In this case, by performing plasma treatment in accordance with the above-described method after the conductive layer 112a and the conductive layer 112b are etched, oxygen can be supplied into the insulating layer 114 and the semiconductor layer 108 through the insulating layer 114 while oxidation of the conductive layer 112a and the conductive layer 112b is prevented. In addition, oxygen in the insulating layer 114 may be supplied to the semiconductor layer 108 by performing heat treatment after the plasma treatment.

Modification Example 5

Figure 10A:
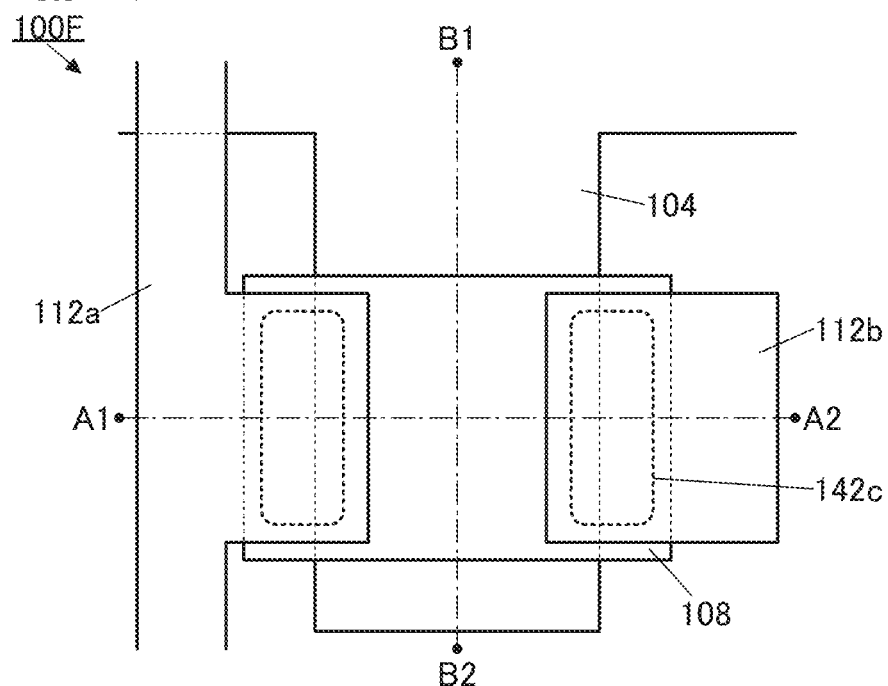
FIGS. 10A-10C A structure example of a transistor.
Figure 10B:
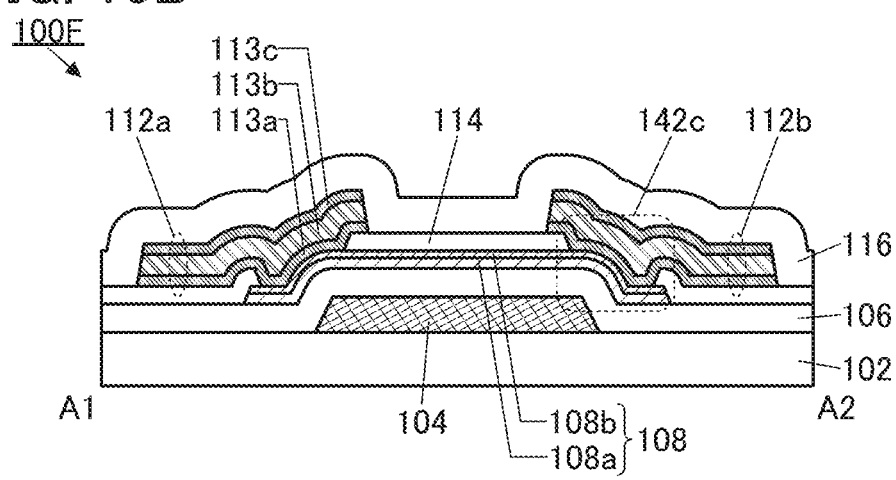
Figure 10C:
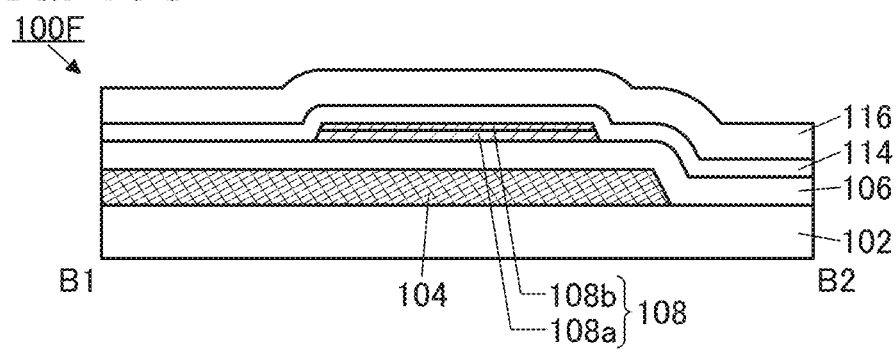

A transistor 100F illustrated in FIGS. 10(A), 10(B), and 10(C) is different from the transistor 100E illustrated in Modification example 4 shown above, mainly in the structure of the insulating layer 114.

The insulating layer 114 is provided to cover the semiconductor layer 108, the insulating layer 106, and the like. In addition, in the insulating layer 114, an opening 142c is provided in a portion where the semiconductor layer 108 is connected to the conductive layer 112a or the conductive layer 112b.

With such a structure, a smaller transistor than that where the insulating layer 114 is processed into an island shape can be provided.

The above is the description of the modification examples.

Application Example

An example of the case where the above-described transistor is used for pixels of a display device will be described below.

Each diagram in FIG. 11 is a schematic top view illustrating a portion of subpixels of the display device. One subpixel includes at least one transistor and a conductive layer (here, the conductive layer 120b) functioning as a pixel electrode. Note that a structure example of a portion of subpixels is shown here in order to simplify the description; however, another transistor, a capacitor, or the like can be provided as appropriate depending on the kind of display elements used in the subpixels, the function to be added to the pixels, and the like.

Figure 11A:
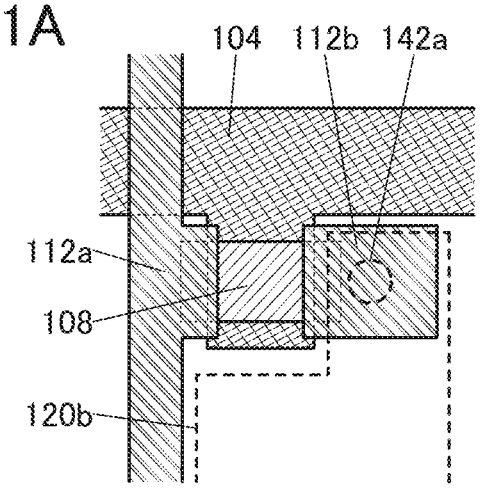
FIGS. 11A-11E Structure examples of a transistor.

In FIG. 11(A), a portion of the conductive layer 104 functions as a gate line (also referred to as a scan line), a portion of the conductive layer 112a functions as a source line (also referred to as a video signal line), and a portion of the conductive layer 112b functions as a wiring that electrically connects the transistor and the conductive layer 120b.

In FIG. 11(A), the conductive layer 104 has a top-view shape with a sticking-out portion, and the semiconductor layer 108 is provided over this sticking-out portion to constitute a transistor.

Figure 11B:
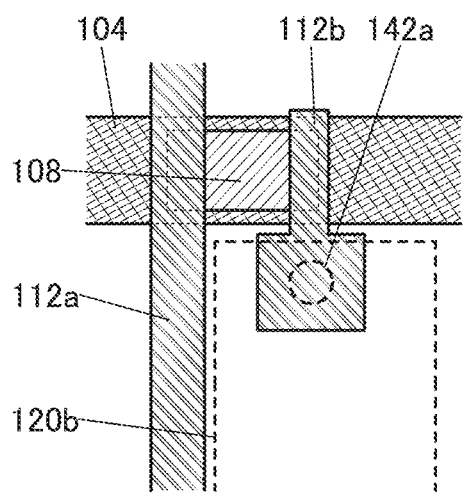
Figure 11C:
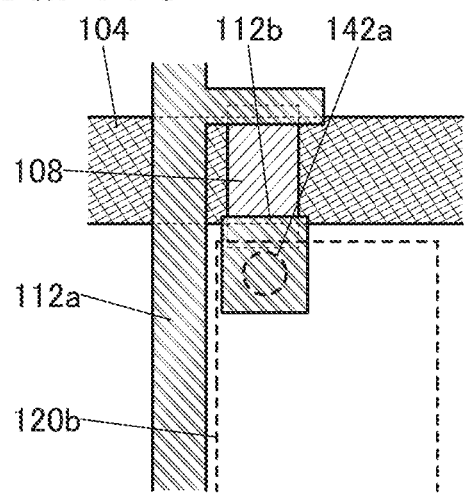

FIGS. 11(B) and 11(C) each show an example in which the conductive layer 104 does not have the sticking-out portion. FIG. 11(B) is an example in which the channel length direction of the semiconductor layer 108 is parallel to the extending direction of the conductive layer 104, and FIG. 11(C) is an example in which these directions are orthogonal.

Figure 11D:
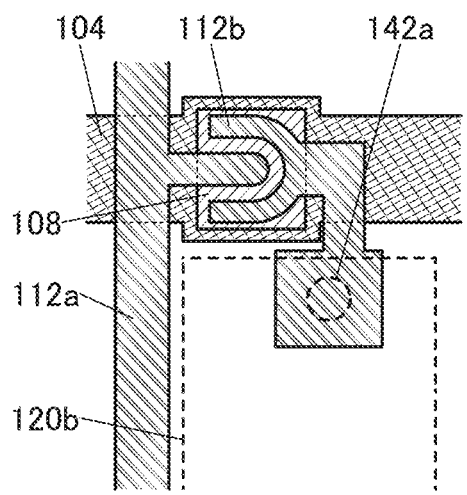
Figure 11E:
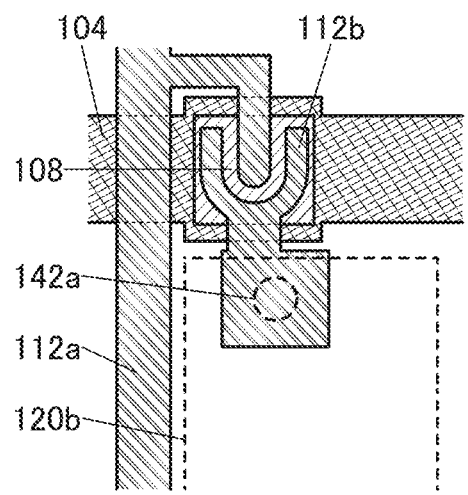

In FIGS. 11(D) and 11(E), the conductive layer 112b has a U-shaped top-view shape with a generally arc-like portion. In addition, the conductive layer 112a and the conductive layer 112b are placed such that the distance between the two is constant over the semiconductor layer 108. With such a structure, the transistor can have a larger channel width and make a larger amount of current flow.

Note that the transistor of one embodiment of the present invention can be used in not only a display device but also a variety of circuits and devices. For example, the transistor of one embodiment of the present invention can be suitably used in various circuits in an IC chip mounted on an electronic device or the like, such as an arithmetic circuit, a memory circuit, a driver circuit, and an interface circuit; or driver circuits for a display device in which a liquid crystal element, an organic EL element, or the like is used or for various sensor devices such as a touch sensor, an optical sensor, and a biosensor.

The above is the description of the application example.

Components of Semiconductor Device

Components included in the semiconductor device of this embodiment will be described below in detail.

Substrate

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate using silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 and the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

Insulating Layer 106

The insulating layer 106 can be formed of a single layer or a stacked layer of an oxide insulating film or a nitride insulating film, for example. To improve the properties of the interface with the semiconductor layer 108, at least a region in the insulating layer 106 that is in contact with the semiconductor layer 108 is preferably formed of an oxide insulating film. Moreover, a film from which oxygen is released by heating is preferably used as the insulating layer 106.

For example, a single layer or a stacked layer using silicon oxide, silicon oxynitride, silicon nitride oxide, silicon nitride, aluminum oxide, hafnium oxide, gallium oxide, Ga—Zn oxide, or the like can be provided as the insulating layer 106.

In the case where a film other than an oxide film, such as a silicon nitride film, is used for the side of the insulating layer 106 that is in contact with the semiconductor layer 108, pretreatment such as oxygen plasma treatment is preferably performed on a surface in contact with the semiconductor layer 108 to oxidize the surface or the vicinity of the surface.

Conductive Film

Conductive films that constitute the semiconductor device, such as the conductive layer 104 and the conductive layer 120a that function as gate electrodes, 120b that functions as a wiring, the conductive layer 112a that functions as one of a source electrode or a drain electrode, and the conductive layer 112b that functions as the other of the source electrode or the drain electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

For the conductive layer 112a that functions as one of the source electrode or the drain electrode and the conductive layer 112b that functions as the other of the source electrode or the drain electrode, in particular, a low-resistance conductive material containing copper, silver, gold, aluminum, or the like is preferably used. Copper or aluminum is particularly preferable because of its high mass-productivity.

For the conductive layers that constitute the semiconductor device, an oxide conductor or a metal oxide film such as In—Sn oxide, In—W oxide, In—W—Zn oxide, In—Ti oxide, In—Ti—Sn oxide, In—Zn oxide, In—Sn—Si oxide, or In—Ga—Zn oxide can also be used.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive layers that constitute the semiconductor device may each have a stacked-layer structure of a conductive film containing the above-described oxide conductor (metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Moreover, a Cu—X alloy film (X is Mn, Ni, Cr, Fe, Co, Mo, Ta, or Ti) may be used for the conductive layer 104, conductive layer 112a, and the conductive layer 112b. The use of a Cu—X alloy film enables the fabrication cost to be reduced because wet etching process can be used in the processing.

Insulating Layer 114 and Insulating Layer 116

For the insulating layer 114 provided over the semiconductor layer 108, insulating layers containing one or more kinds of a silicon oxide film, a silicon oxynitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like formed by a PECVD method, a sputtering method, an ALD method, or the like can be used. It is particularly preferable to use a silicon oxide film or a silicon oxynitride film formed by a plasma CVD method. Note that the insulating layer 114 may have a stacked-layer structure of two or more layers.

As the insulating layer 116 functioning as a protective layer, an insulating layer containing one or more kinds of a silicon nitride oxide film, a silicon nitride film, an aluminum nitride film, an aluminum nitride oxide film, and the like formed by a PECVD method, a sputtering method, an ALD method, or the like can be used. Note that the insulating layer 116 may have a stacked-layer structure of two or more layers.

Semiconductor Layer

In the case where the semiconductor layer 108 is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, which facilitates formation of the semiconductor layer 108 having crystallinity. Note that the atomic ratio in the semiconductor layer 108 to be formed may vary in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the formed semiconductor layer 108 is sometimes in the neighborhood of In:Ga:Zn=4:2:3 [atomic ratio].

Note that when the atomic ratio is described as In:Ga:Zn=4:2:3 or in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The energy gap of the semiconductor layer 108 is 2 eV or more, preferably 2.5 eV or more. With the use of such a metal oxide having a wider energy gap than silicon, the off-state current of the transistor can be reduced.

Furthermore, the semiconductor layer 108 preferably has a non-single-crystal structure. The non-single-crystal structure includes, for example, a CAAC structure which will be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. On the other hand, a clear grain boundary cannot be observed in the CAAC-OS; thus, it can be said that a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

An example of a crystal structure of a metal oxide is described. Note that a metal oxide deposited by a sputtering method using an In—Ga—Zn oxide target (In:Ga:Zn=4:2:4.1 [atomic ratio]) is described below as an example. A metal oxide that is deposited by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated intentionally.

The above is the description of each of the components.

At least part of this embodiment can be implemented in combination with the other embodiments described in this specification as appropriate.

Embodiment 2

In this embodiment, an example of a display device that includes any of the transistors described in the above embodiment will be described.

Structure Example

FIG. 12(A) is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS(Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

A display device 700A illustrated in FIG. 12(B) is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as shown in a region P1 in FIG. 12(B). A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 12(B). When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

A display device 700B illustrated in FIG. 12(C) is a display device that can be suitably used for an electronic device with a large screen. For example, the display device 700B can be suitably used for a television device, a monitor device, a personal computer (including a laptop type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the first substrate 701. Thus, an electronic device with a narrow bezel can be provided.

With such a structure, a large-size and high-resolution display device can be provided. For example, use in a display device with a screen diagonal of 30 inches or more, 40 inches or more, 50 inches or more, or 60 inches or more is possible. Furthermore, a display device with extremely high resolution such as 4K2K or 8K4K can be provided.

Cross-Sectional Structure Example

Figure 13:
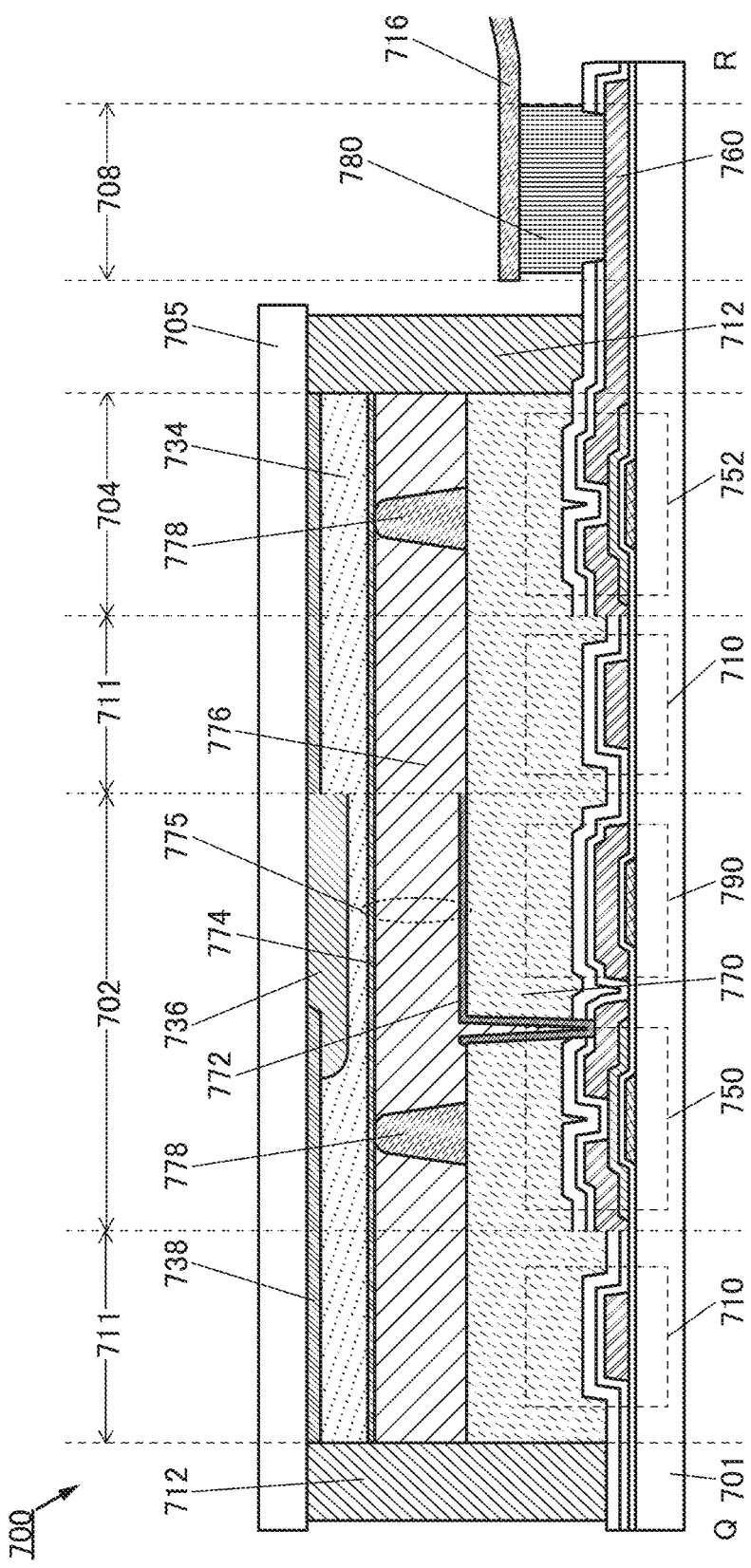
FIG. 13 A cross-sectional view of a display device.
Figure 14:
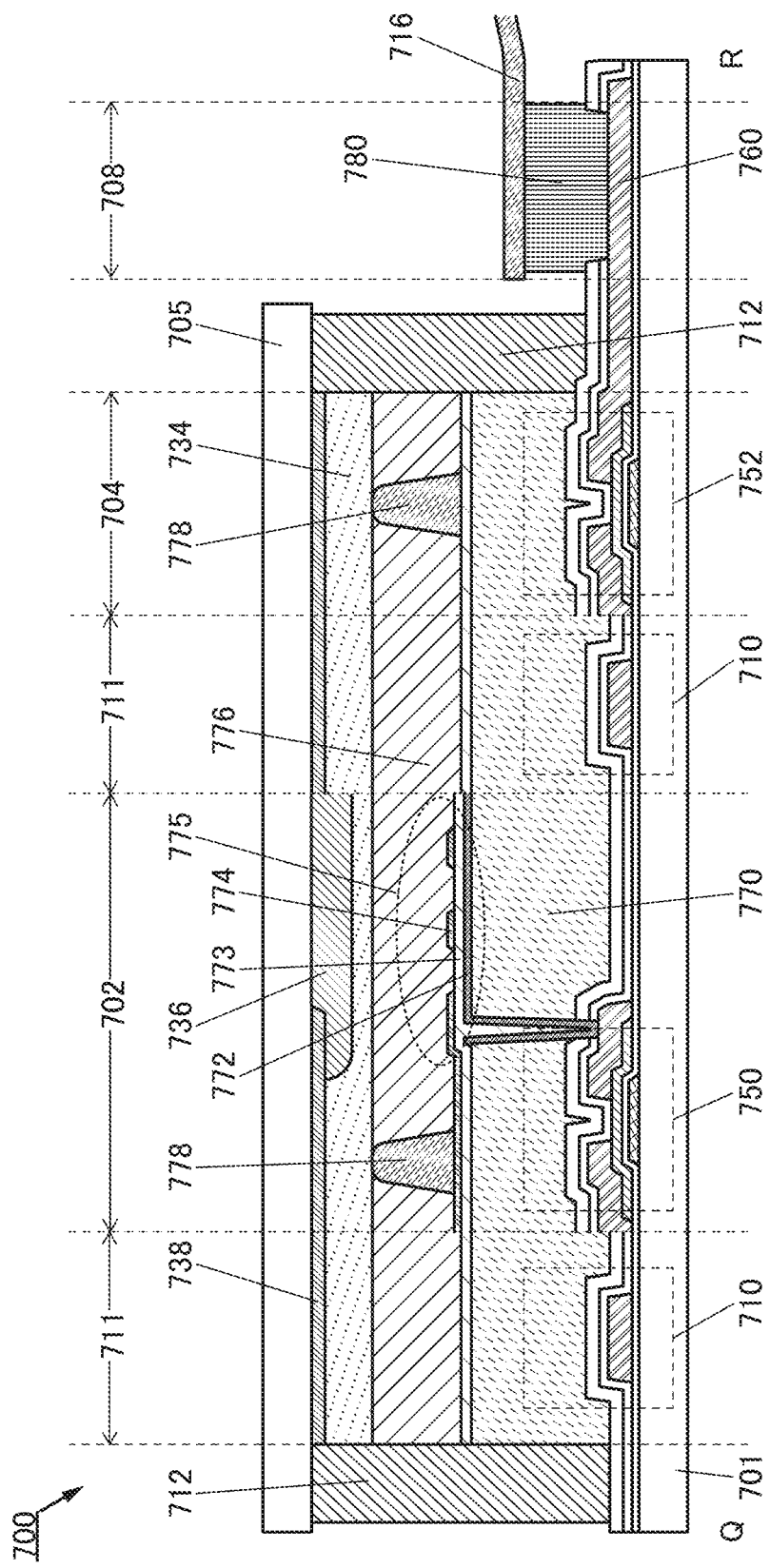
FIG. 14 A cross-sectional view of a display device.
Figure 15:
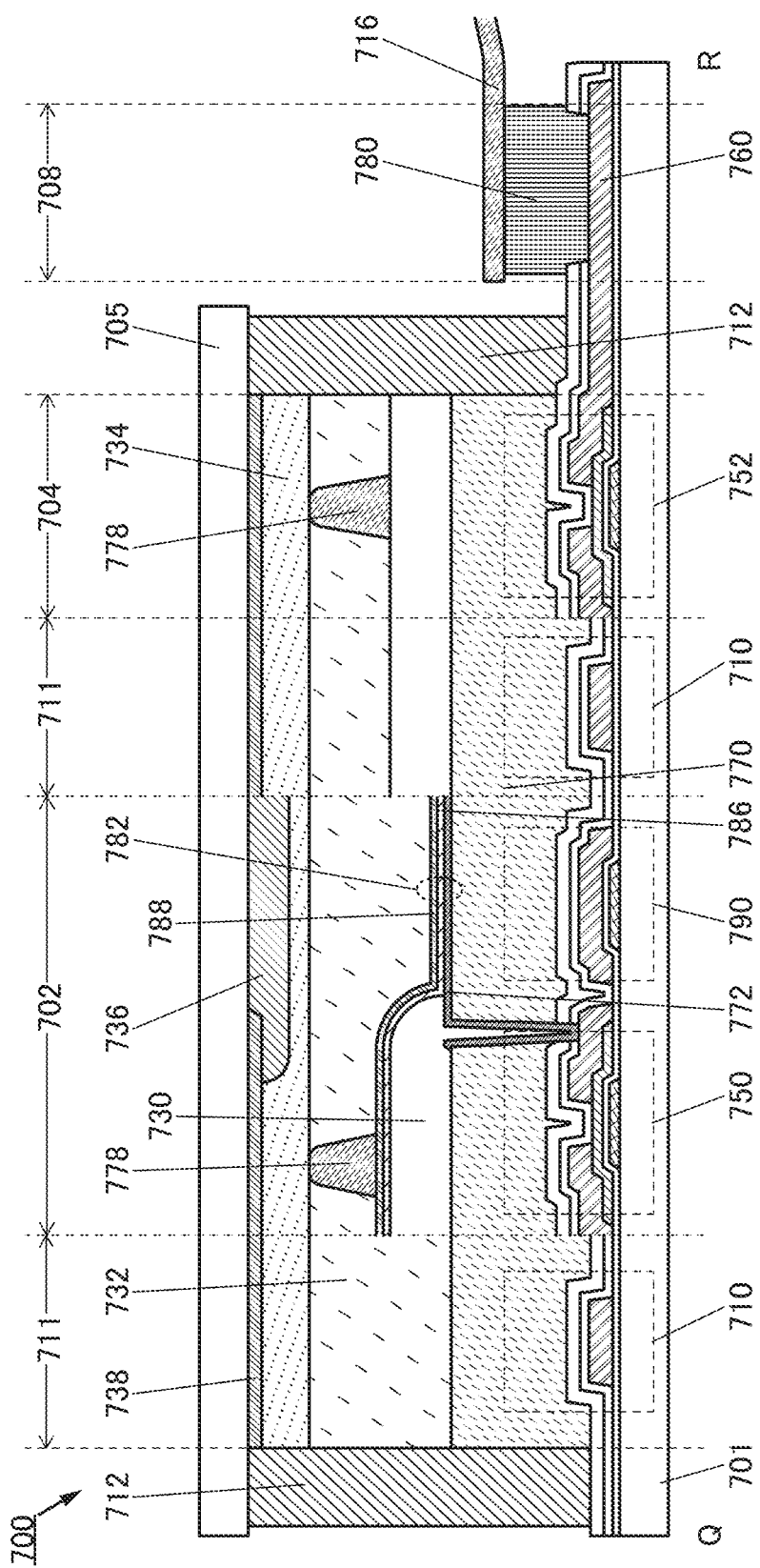
FIG. 15 A cross-sectional view of a display device.
Figure 16:
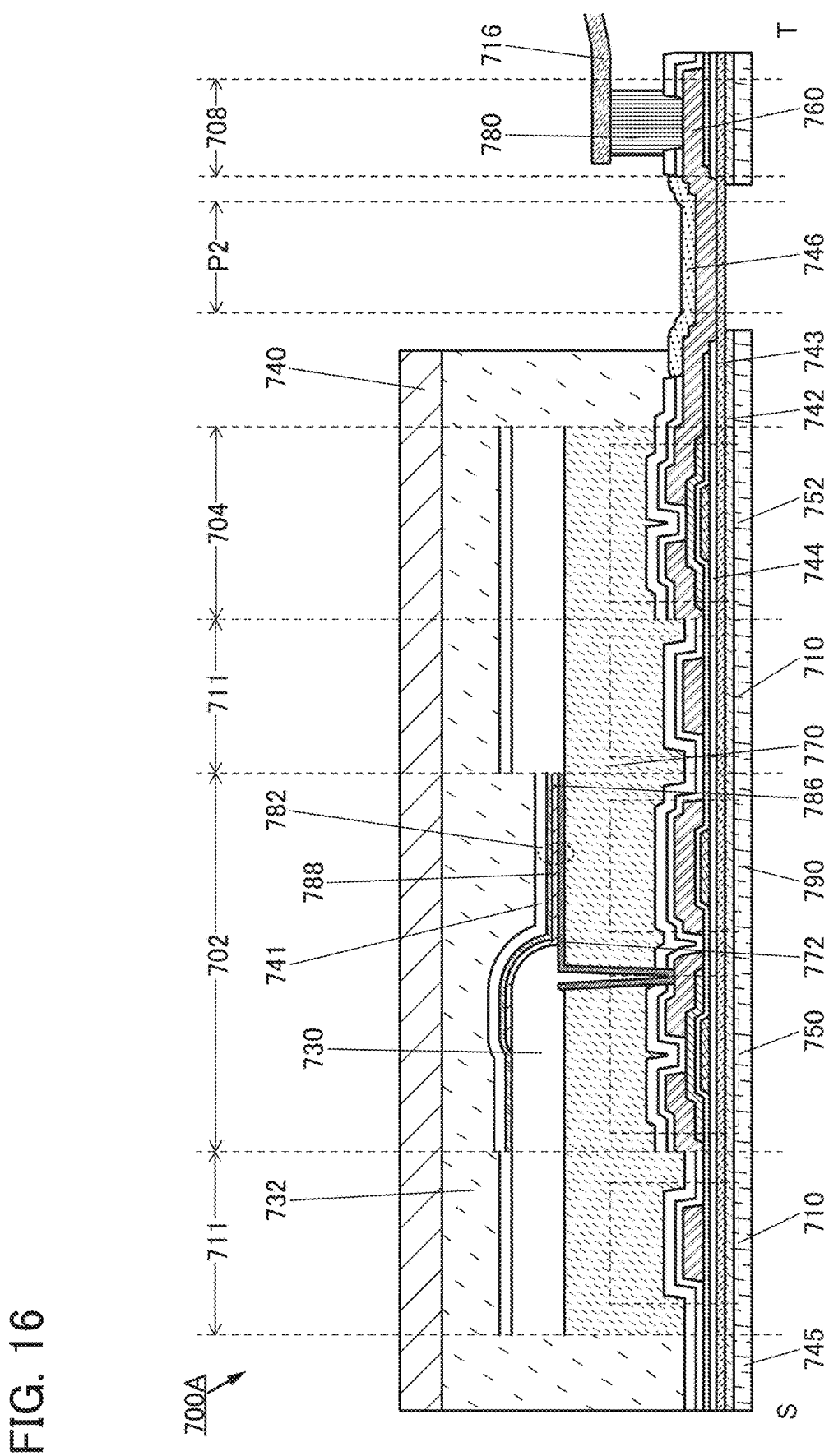
FIG. 16 A cross-sectional view of a display device.

Structures using a liquid crystal element or an EL element as a display element will be described below with reference to FIG. 13 to FIG. 16. Note that FIG. 13 to FIG. 15 are cross-sectional views taken along dashed-dotted line Q-R in FIG. 12(A). FIG. 16 is a cross-sectional view taken along dashed-dotted line S-T in the display device 700A in FIG. 12(B). FIG. 13 and FIG. 14 are each a structure using a liquid crystal element as a display element, and FIG. 15 and FIG. 16 are each a structure using an EL element.

Description of Common Portions in Display Devices

Display devices in FIG. 13 to FIG. 16 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 14 shows a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writes of an image signal can be set longer. Thus, frequency of refresh operation can be reduced, which leads to lower power consumption.

In addition, the transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 illustrated in FIG. 13, FIG. 15, and FIG. 16 includes a lower electrode formed by processing the same film as the gate electrode of the transistor 750 and an upper electrode formed by processing the same conductive film as the source electrode or the drain electrode. Part of an insulating film functioning as a gate insulating layer of the transistor 750 is provided between the lower electrode and the upper electrode. That is, the capacitor 790 has a stacked-layer structure in which an insulating film functioning as a dielectric film is positioned between a pair of electrodes.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that the same can be said for the gate driver circuit portion 706, as the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. The wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

Structure Example of Display Device Using Liquid Crystal Element

The display device 700 illustrated in FIG. 13 includes a liquid crystal element 775. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material including indium, zinc, tin, or the like is preferably used. As a reflective material, for example, a material including aluminum, silver, or the like is preferably used.

When a reflective material is used for the conductive layer 772, the display device 700 is a reflective liquid crystal display device. When a light-transmitting material is used for the conductive layer 772, the display device 700 is a transmissive liquid crystal display device. For a reflective liquid crystal display device, a polarizing plate is provided on the viewer side. By contrast, for a transmissive liquid crystal display device, a pair of polarizing plates is provided so that the liquid crystal element is placed therebetween.

The display device 700 in FIG. 14 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 14, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 13 and FIG. 14, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like.

In addition, a scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

Display Device Using Light-Emitting Element

The display device 700 illustrated in FIG. 15 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 shown in FIG. 15, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 16 illustrates a structure of a display device suitably applicable to a flexible display. FIG. 16 is a cross-sectional view taken along the dashed-dotted line S-T in the display device 700A in FIG. 12(B).

The display device 700A in FIG. 16 has a structure in which a support substrate 745, a bonding layer 742, the resin layer 743, and an insulating layer 744 are stacked instead of the first substrate 701 in FIG. 15. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film such as a silicon oxide film, a silicon oxynitride film, a silicon nitride film, or the like. The resin layer 743 and the support substrate 745 are attached to each other with the bonding layer 742. The resin layer 743 is preferably thinner than the support substrate 745.

The display device 700 in FIG. 16 includes a protective layer 740 instead of the second substrate 705 in FIG. 15. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 16 shows the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When an inorganic insulating film is not provided in the region P2 that can be bent and only a conductive layer containing a metal or an alloy and a layer containing an organic material are stacked, generation of cracks at the time of bending can be prevented. When the support substrate 745 is not provided in the region P2, part of the display device 700A can be bent with an extremely small radius of curvature.

Structure Example of Display Device Provided with Input Device

An input device such as a touch sensor may be provided in the display device 700 illustrated in FIG. 13 to FIG. 16.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include a so-called in-cell touch panel in which an input device is provided inside between a pair of substrates, a so-called on-cell touch panel in which an input device is formed over the display device 700, or a so-called out-cell touch panel in which an input device is attached to the display device 700.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes the semiconductor device of one embodiment of the present invention will be described with reference to FIG. 17.

Figure 17A:
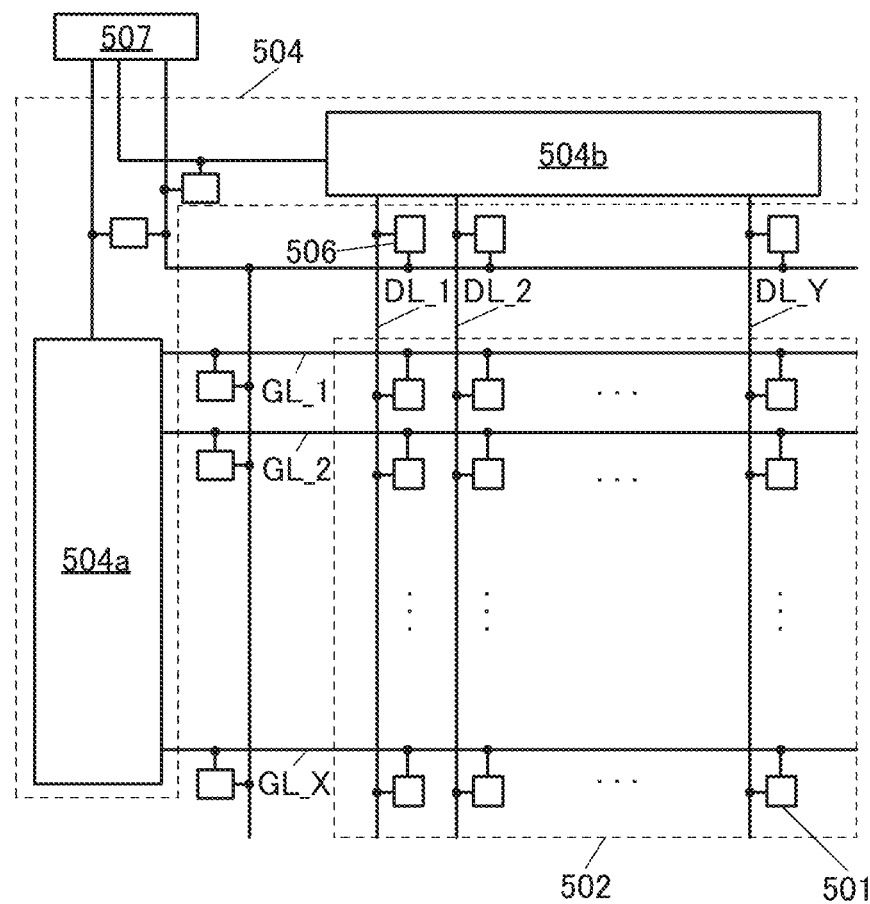
FIGS. 17A-17C A block diagram and circuit diagrams of a display device.

A display device illustrated in FIG. 17(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 17(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 17B:
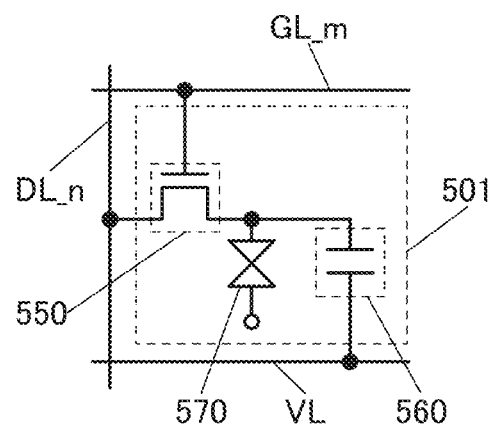
Figure 17C:
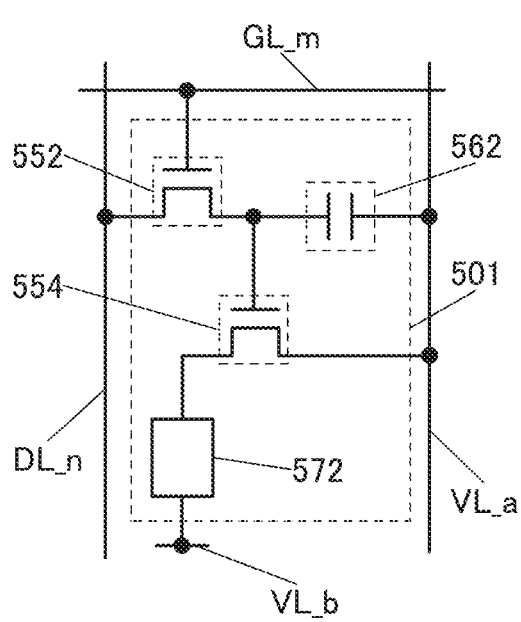

The plurality of pixel circuits 501 illustrated in FIG. 17(A) can have a configuration illustrated in FIG. 17(B) or FIG. 17(C), for example.

The pixel circuit 501 illustrated in FIG. 17(B) includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 17(C) includes transistors 552 and 554, a capacitor 562, and a light-emitting element 572. The data line DL_n, the scan line GL_m, a potential supply line VL_a, a power supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

Circuit Configuration

Figure 18A:
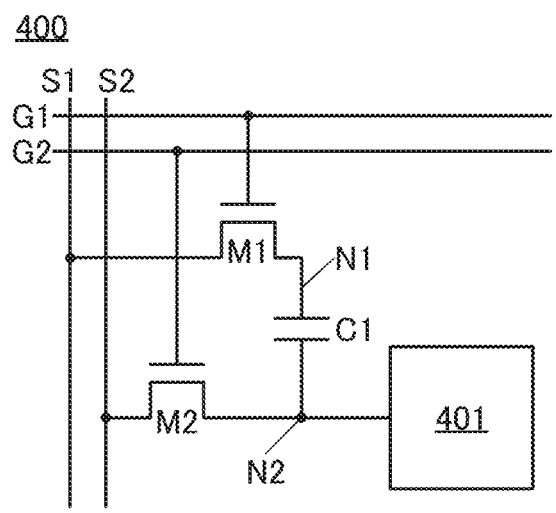
FIGS. 18A-18D Circuit diagrams and a timing chart of a display device.

FIG. 18(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 18B:
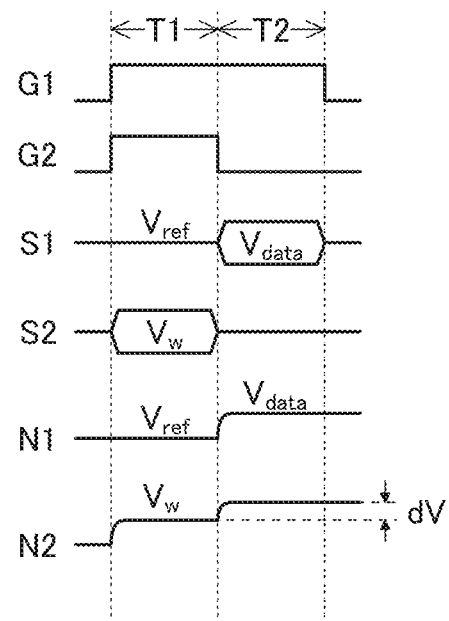

Next, an example of a method for operating the pixel circuit 400 is described with reference to FIG. 18(B). FIG. 18(B) is a timing chart of the operation of the pixel circuit 400.

Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 18(B), one frame period is divided into a period T1 and a period T2. The period T1 is a period in which a potential is written to the node N2, and the period T2 is a period in which a potential is written to the node N1.

Period T1

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w - V_{ref}$ is retained in the capacitor C1.

Period T2

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 18(B), dV may be a negative value. That is, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

APPLICATION EXAMPLES

Example Using Liquid Crystal Element

Figure 18C:
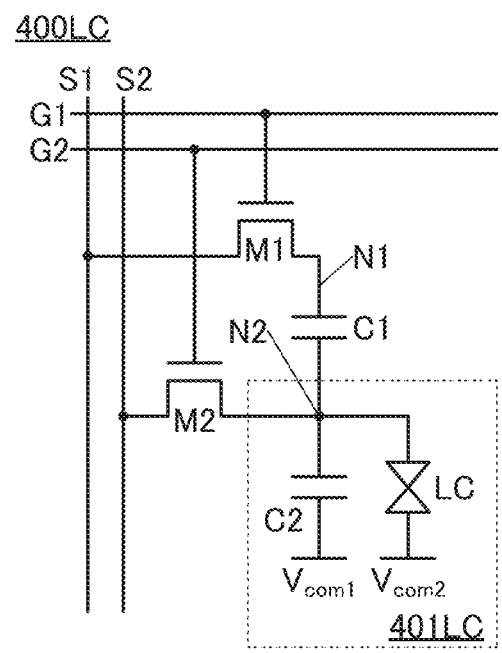

A pixel circuit 400LC illustrated in FIG. 18(C) includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

Example Using Light-Emitting Element

Figure 18D:
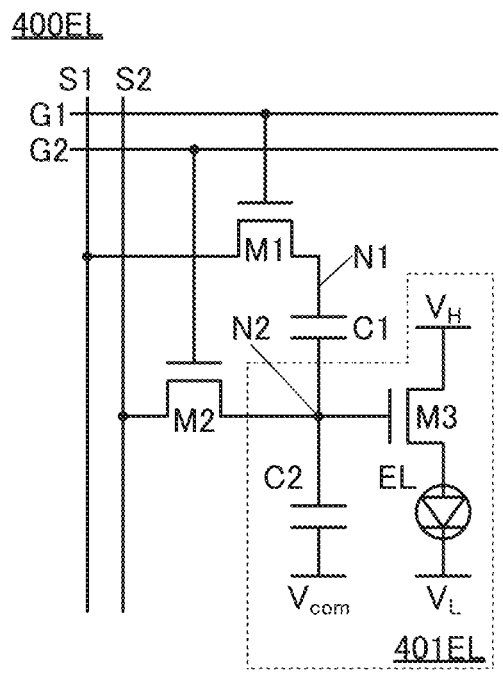

A pixel circuit 400EL illustrated in FIG. 18(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits shown in FIG. 18(C) and FIG. 18(D), and a configuration to which a transistor, a capacitor, or the like is further added may be employed.

At least part of this embodiment can be implemented in combination with the other embodiments described in this specification as appropriate.

Embodiment 5

In this embodiment, a display module that can be fabricated using one embodiment of the present invention will be described.

Figure 19A:
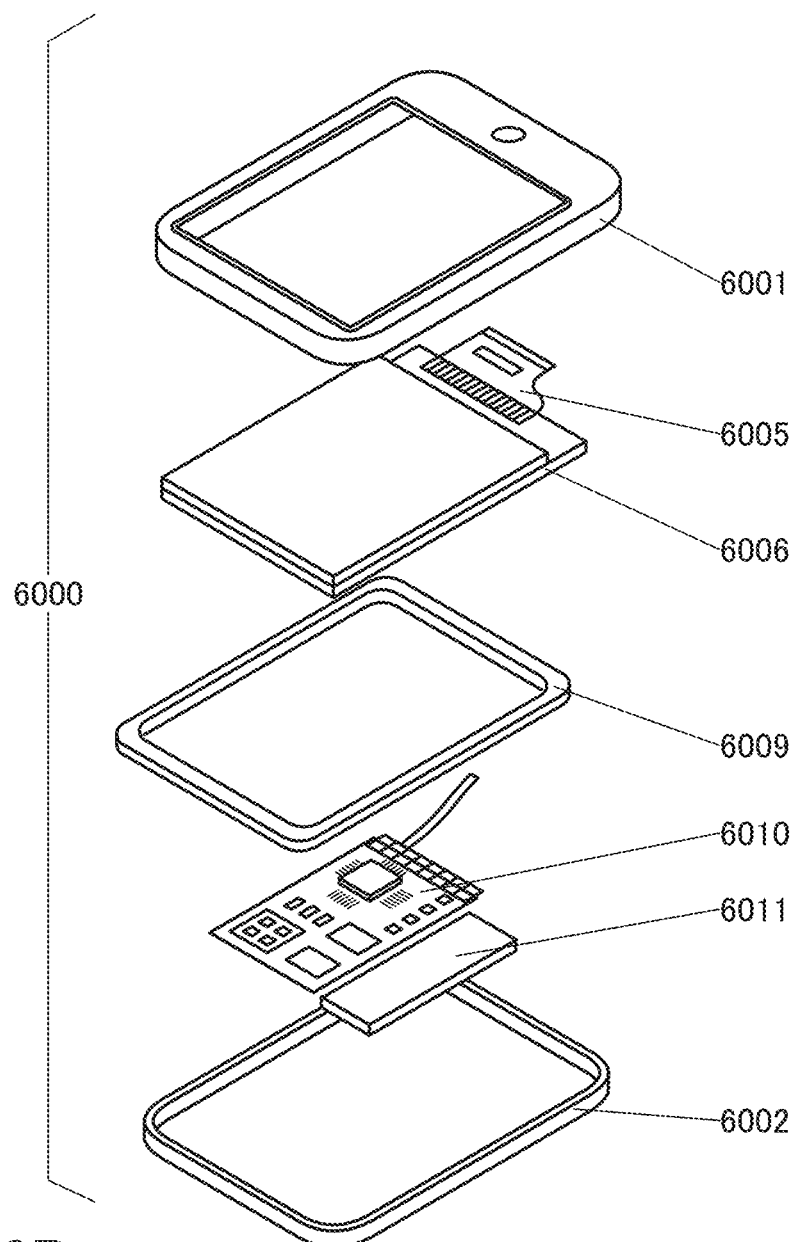
FIGS. 19A-19B A structure example of a display module.

In a display module 6000 illustrated in FIG. 19(A), a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. The power supply may be from the battery 6011.

Figure 19B:
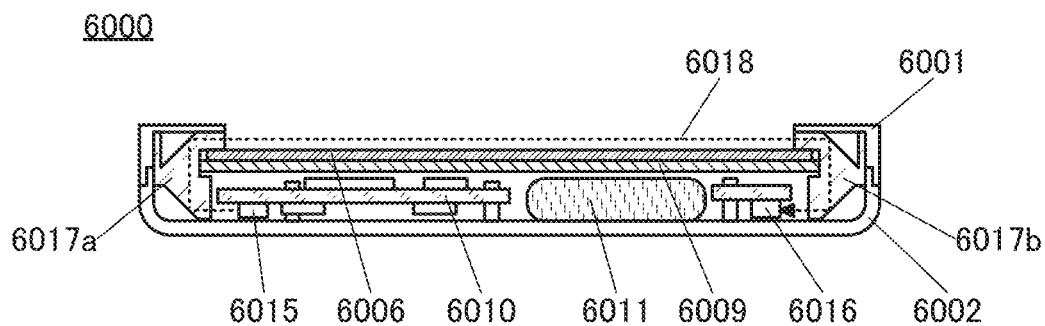

FIG. 19(B) is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 6

In this embodiment, examples of an electronic device for which the display device of one embodiment of the present invention can be used will be described.

Figure 20A:
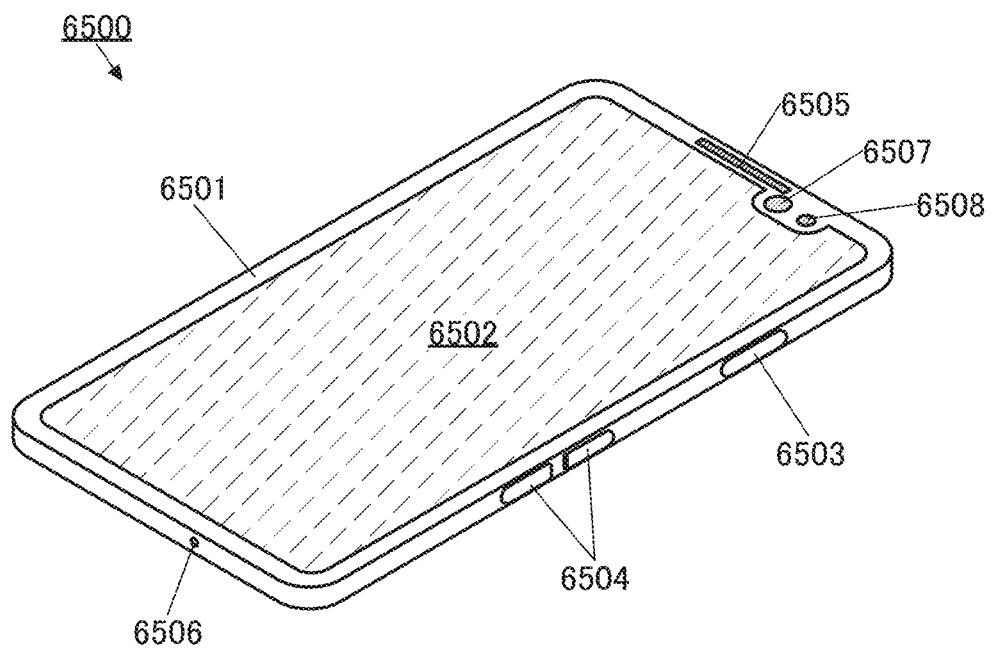
FIGS. 20A-20B Structure examples of electronic devices.

An electronic device 6500 illustrated in FIG. 20(A) is a portable information terminal that can be used as a smartphone.

The electronic device 6500 includes, in a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 20B:
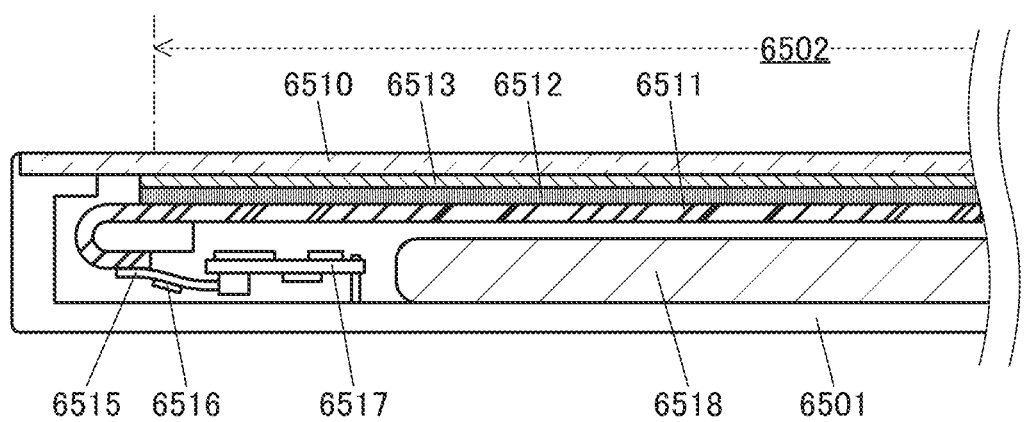

FIG. 20(B) is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with any of the other embodiments described in this specification as appropriate.

Embodiment 7

In this embodiment, electronic devices each including a display device fabricated using one embodiment of the present invention will be described.

Electronic devices shown below include a display device of one embodiment of the present invention in a display portion. Thus, the electronic devices achieve high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a laptop personal computer, a monitor device, digital signage, a pachinko machine, and a game machine.

The electronic device using one embodiment of the present invention can be incorporated along a flat surface or a curved surface of an inside wall or an outside wall of a house or a building, an interior or an exterior of a car, or the like.

Figure 21A:
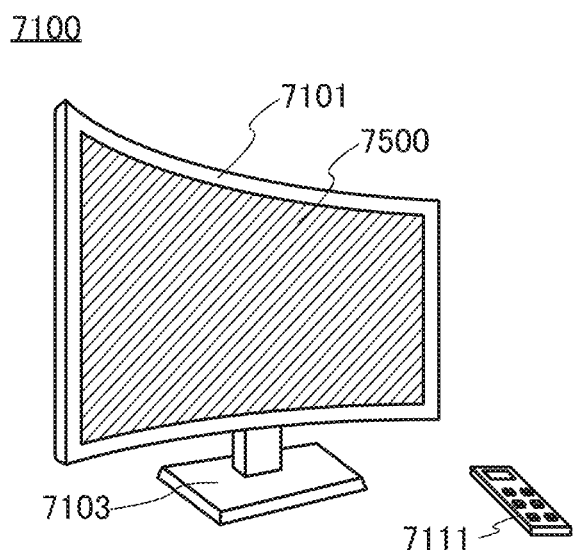
FIGS. 21A-21D Structure examples of electronic devices.

FIG. 21(A) illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 21(A) can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver and a communication device for network connection.

Figure 21B:
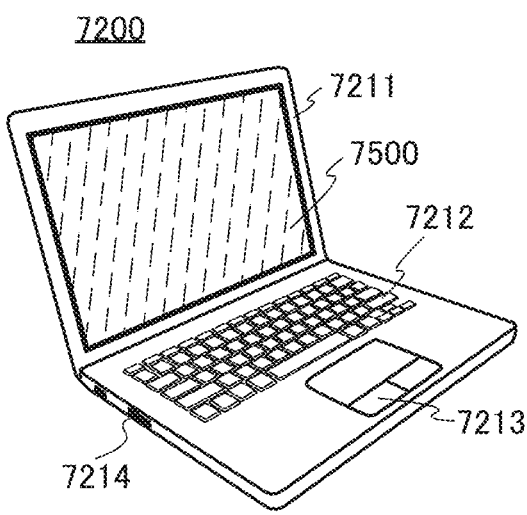

FIG. 21(B) illustrates a laptop personal computer 7200. The laptop personal computer 7200 includes a housing 7211, a keyboard 7212, a pointing device 7213, an external connection port 7214, and the like. The display portion 7500 is incorporated in the housing 7211.

Figure 21C:
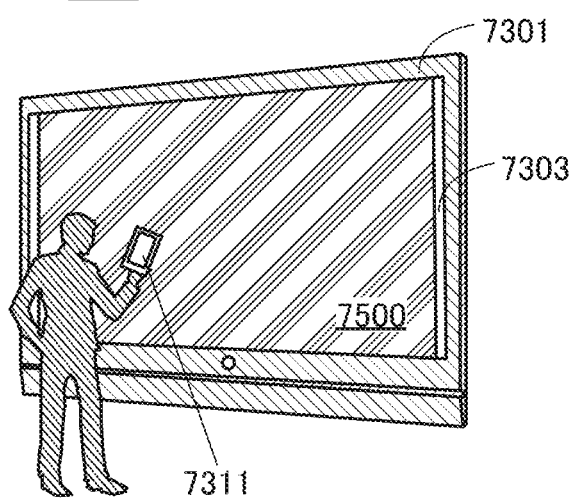
Figure 21D:
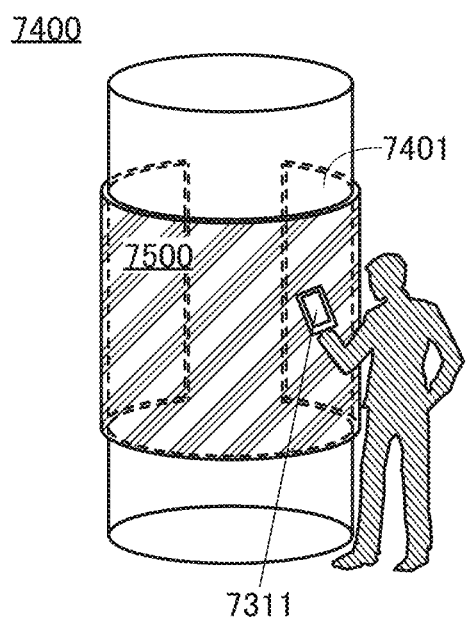

FIGS. 21(C) and 21(D) illustrate examples of digital signage.

Digital signage 7300 illustrated in FIG. 21(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 21(D) is digital signage 7400 attached to a cylindrical pillar 7401. The digital signage 7400 includes the display portion 7500 provided along a curved surface of the pillar 7401.

A larger display portion 7500 can increase the amount of information that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIGS. 21(C) and 21(D), it is preferable that the digital signage 7300 or the digital signage 7400 can work with an information terminal 7311, such as a user's smartphone, through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIGS. 21(A) to 21(D).

The electronic devices of this embodiment each include a display portion; however, one embodiment of the present invention can also be applied to an electronic device without a display portion.

At least part of this embodiment can be implemented in combination with the other embodiments described in this specification as appropriate.

EXAMPLE 1

In this example, samples in which a conductive film containing copper was subjected to plasma treatment were fabricated, and cross-sectional observations, EDX analyses, and XPS analyses were performed.

Cross-Sectional Observations and EDX Analyses

Fabrication of Samples

First, an oxide semiconductor film (IGZO) with a thickness of approximately 30 nm was formed over a glass substrate (glass). The oxide semiconductor film was formed by a sputtering method with use of an In—Ga—Zn oxide target. Next, a tungsten film (W) with a thickness of approximately 5 nm and a copper film (Cu) with a thickness of approximately 200 nm were formed by a sputtering method to be stacked. Next, a resist mask was formed over the copper film, the copper film and the tungsten film were etched by a wet etching method, and then the resist mask was removed.

Next, a silicon oxynitride film (SiON) with a thickness of approximately 100 nm was formed successively after performing plasma treatment under the following conditions, without exposure to the air. The plasma treatment and formation of the silicon oxynitride film were successively performed in the same film formation chamber of a PECVD apparatus. For the formation of the silicon oxynitride film, a mixed gas of an SiH$_4$ gas and an N$_2$O gas was used as the film formation gas.

Here, four kinds of samples were fabricated in total: three kinds of samples (Samples A1 to A3) subjected to plasma treatment under different conditions and a sample (comparative sample: Ref) not subjected to plasma treatment.

Each of the plasma treatment was performed for 15 seconds under the conditions where the pressure was 200 Pa, the electric power was 150 W, and the temperature was 220° C. The plasma treatment was performed while the flow rates of the N$_2$O gas and the NH$_3$ gas were controlled. The flow rate of the N$_2$O gas was set to 3000 sccm for each of Sample A1 to Sample A3. For Sample A1, a condition where the NH$_3$ gas was not introduced (0 sccm) was employed. For Sample A2, the flow rate of the NH$_3$ gas was 500 sccm. For Sample A3, the flow rate of the NH$_3$ gas was 1500 sccm.

Cross-Sectional Observations and EDX Analyses

Next, cross-sectional observations and EDX analyses of the fabricated four samples were performed. For the cross-sectional observations and EDX analyses, a scanning transmission electron microscope (STEM) was used.

In FIGS. 22(A1) to 22(D1), cross-sectional observation images of the comparative sample (Ref.), Sample A1, Sample A2, and Sample A3 are shown. A dashed line in each diagram indicates a portion where EDX line analysis was performed. In FIGS. 22(A2) to 22(D2), the measurement result of EDX line analysis for each sample is displayed, being superimposed on the cross-sectional image. Each diagram shows changes in detection intensity in the thickness direction of four kinds of elements: a nitrogen element (N), an oxygen element (O), a silicon element (Si), and a copper element (Cu).

Note that in FIGS. 22(A1) to 22(D1), an end portion of the copper film has an undercut shape. This is attributed to the etching conditions not being sufficiently optimized, but does not affect the purpose of this analysis in any way.

First, as shown in FIGS. 22(A1) and 22(A2), an oxide was not observed clearly on the surface of the copper film (Cu) of the comparative sample since plasma treatment was not performed thereon.

As shown in FIG. 22(B1), Sample A1 was found to have another layer with a different contrast formed on the surface of the copper film. In addition, as shown in FIG. 22(B2), changes in detection intensity of copper, silicon, and oxygen are gradual at the interface between the copper film and the silicon oxynitride film, which indicates that an oxide containing copper and silicon is formed at the interface. The fact that the oxide contains not only copper but also silicon leads to the inference that a mixed layer of an oxide of copper and silicon oxynitride was formed by depositing a silicon oxynitride film in the state where an oxide of copper is formed on the surface of the copper film by plasma treatment.

By contrast, as shown in FIGS. 22(C1) and 22(D1), formation of another layer is not observed at the interface between the copper film and the silicon oxynitride film in Sample A2 and Sample A3 on which plasma treatment using the NH$_3$ gas was performed. Also in FIGS. 22(C2) and 22(D2), changes in detection intensity of copper, silicon, and oxygen at the interface between the copper film and the silicon oxynitride film are sharp, which indicates that a concrete oxide like the one in Sample A1 was not formed.

From the above results, it was found that performing plasma treatment using a mixed gas of a gas containing an oxygen element and a gas containing a hydrogen element in the state where the surface of the conductive film containing copper is uncovered suitably suppresses oxidation of the surface of the conductive film containing copper. Furthermore, it was found that even in the case where an oxide film such as a silicon oxynitride film is formed right after the plasma treatment, another layer is less likely to be formed at the interface with the conductive film containing copper.

XPS Analyses

Fabrication of Samples

First, an oxide semiconductor film with a thickness of approximately 40 nm was formed over a glass substrate. The oxide semiconductor film was formed by a sputtering method with use of an In—Ga—Zn oxide target. Next, a tungsten film with a thickness of approximately 5 nm and a copper film with a thickness of approximately 200 nm were formed by a sputtering method.

Next, four kinds of samples were fabricated in total: three kinds of samples subjected to plasma treatment under different conditions and a sample not subjected to plasma treatment.

The plasma treatment was performed with use of a PECVD apparatus for 15 seconds under the conditions where the pressure was 200 Pa, the electric power was 150 W, and the temperature was 220° C. The plasma treatment was performed while the flow rates of the N$_2$O gas and the NH$_3$ gas were controlled. The flow rate of the N$_2$O gas was set to 3000 sccm, and the flow rate of NH$_3$ gas was set to the following three conditions: 0 sccm, 500 sccm, and 1500 sccm.

XPS Analyses

Figure 23A:
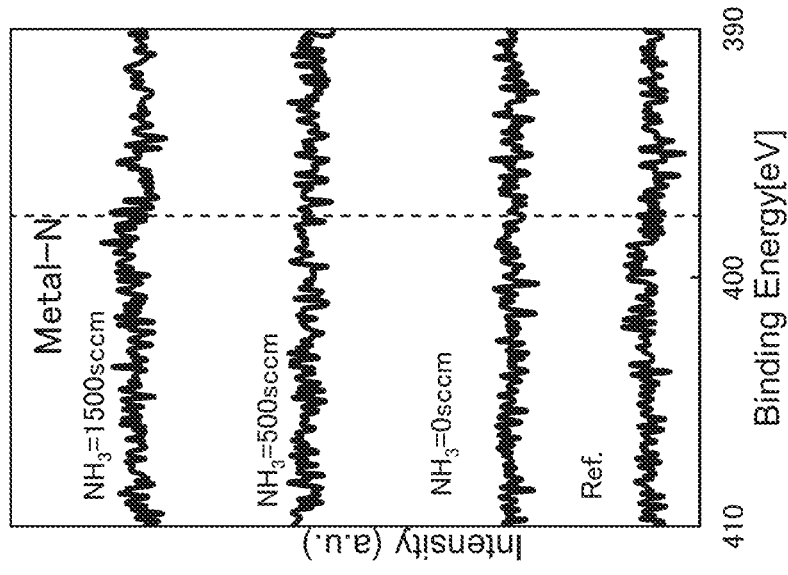
FIGS. 23A-23B XPS analyses results related to Example 1.
Figure 23B:
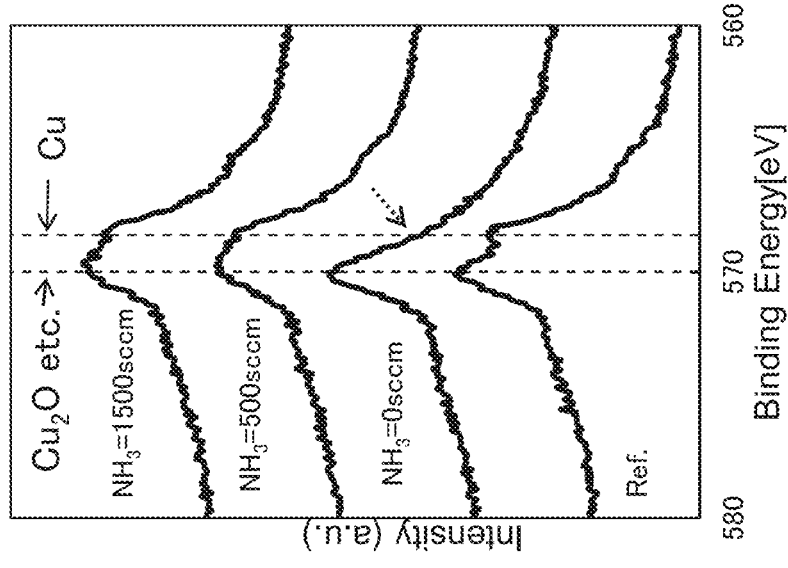

XPS analyses were performed on the samples fabricated as above. As an X-ray source for the XPS measurement, Mg—Kα (1253.6 eV) was used. FIGS. 23(A) and 23(B) respectively show XPS spectra in the energy range where peaks of Cu and N elements are obtained. In each graph, the horizontal axis represents binding energy [eV] and the vertical axis represents intensity (a.u.) of photoelectrons.

In FIG. 23(A), a peak position corresponding to Auger electrons of Cu in a metal state (LMM transition) (referred to as Auger LMM) and a peak position corresponding to the oxide of Cu (referred to as Cu$_2$O etc.) are each shown with a dashed line. As for the sample on which the plasma treatment was not performed (referred to as Ref) and the samples on which the plasma treatment was performed with use of a mixed gas of the N$_2$O gas and the NH$_3$ gas (NH$_3$=1500 sccm and NH$_3$=500 sccm), the peak of Cu in a metal state is clearly observed. By contrast, as for the sample on which the plasma treatment was performed with use of only the N$_2$O gas (NH$_3$=0 sccm), a peak derived from Cu in a metal state was not clearly observed as indicated by the dashed arrow.

In FIG. 23(B), a peak position corresponding to the binding energy at the time of the N atom becoming bonded to a metal is shown by a dashed line. As shown in FIG. 23(B), a clear peak was not observed under any conditions, and nitriding of the surface of the conductive film containing copper was not seen.

These results indicate that oxidation of the surface of the conductive film containing copper is suitably prevented by performing plasma treatment using a mixed gas of a gas containing an oxygen element and a gas containing a hydrogen element. In addition, it was found that nitriding of the surface containing copper was not generated even in the case where a gas containing nitrogen is used for the plasma treatment.

EXAMPLE 2

In this example, a transistor was fabricated by using the fabrication method according to one embodiment of the present invention, and its electrical characteristics were measured.

Fabrication of Samples

For the structure of the fabricated transistors, the structure of the transistor 100A shown in Embodiment 1 and FIG. 2 can be employed.

First, a tungsten film with a thickness of approximately 100 nm was formed over a glass substrate by a sputtering method, and the tungsten film was processed to obtain a first gate electrode. Next, as a first gate insulating layer, a stacked-layer film including a silicon nitride film with a thickness of approximately 400 nm and a silicon oxynitride film with a thickness of approximately 5 nm was formed by a plasma CVD method.

Next, a metal oxide film with a thickness of approximately 30 nm was formed over the first gate insulating layer, and the metal oxide film was processed to obtain a semiconductor layer. The metal oxide film was formed by a sputtering method using an In—Ga—Zn oxide target (In:Ga:Zn=4:2:4.1 [atomic ratio]). After that, heat treatment was performed at a temperature of 350° C. in a nitrogen atmosphere for one hour and subsequently, heat treatment was performed at 350° C. in a mixed atmosphere of oxygen and nitrogen for one hour.

Next, a tungsten film with a thickness of approximately 5 nm, a copper film with a thickness of approximately 200 nm, and a tungsten film with a thickness of approximately 5 nm were formed by a sputtering method, and each of them was etched by a wet etching method, whereby a source electrode and a drain electrode were obtained.

Next, a silicon oxynitride film with a thickness of approximately 30 nm and a silicon oxynitride film with a thickness of approximately 400 nm were formed to be stacked successively after performing plasma treatment under the following conditions, without exposure to the air. The plasma treatment and formation of the silicon oxynitride film were performed in the same treatment chamber of a PECVD apparatus.

Here, two kinds of samples (Samples B1 and B2) subjected to plasma treatment under different conditions were fabricated.

The plasma treatment was performed for 15 seconds under the conditions where the pressure was 200 Pa, the electric power was 150 W, and the temperature was 220° C. The plasma treatment was performed while the flow rates of the $N_2O$ gas and the $NH_3$ gas were controlled. The flow rate of the $N_2O$ gas was set to 3000 sccm for each of Sample B1 and Sample B2. For Sample B1, a condition where the $NH_3$ gas was not introduced (0 sccm) was employed. For Sample B2, the flow rate of the $NH_3$ gas was 500 sccm.

After that, heat treatment was performed in a nitrogen atmosphere at 350° C. for one hour. Next, a metal oxide film was formed over the silicon oxynitride film by a sputtering method in an oxygen-containing atmosphere, whereby oxygen was supplied to the silicon oxynitride film, and then, the metal oxide film was removed. Next, a silicon nitride film with a thickness of approximately 100 nm was formed by a plasma CVD method. Next, an indium tin oxide film containing silicon was formed by a sputtering method, and then the film was processed, whereby a second gate electrode was obtained.

Through the above steps, transistors each formed over a glass substrate were obtained.

ID-VG Characteristics of Transistors

Next, the ID-VG characteristics of the transistors fabricated as above were measured.

As the conditions for measuring the ID-VG characteristics of the transistors, a voltage applied to the first gate electrode and the second gate electrode (hereinafter also referred to as a gate voltage (VG)) was applied from −15 V to +20 V in increments of 0.25 V. Moreover, a voltage applied to the source electrode (hereinafter also referred to as a source voltage (VS)) was 0 V (comm), and a voltage applied to the drain electrode (hereinafter also referred to as a drain voltage (VD)) was 0.1 V and 15 V.

Figure 24A:
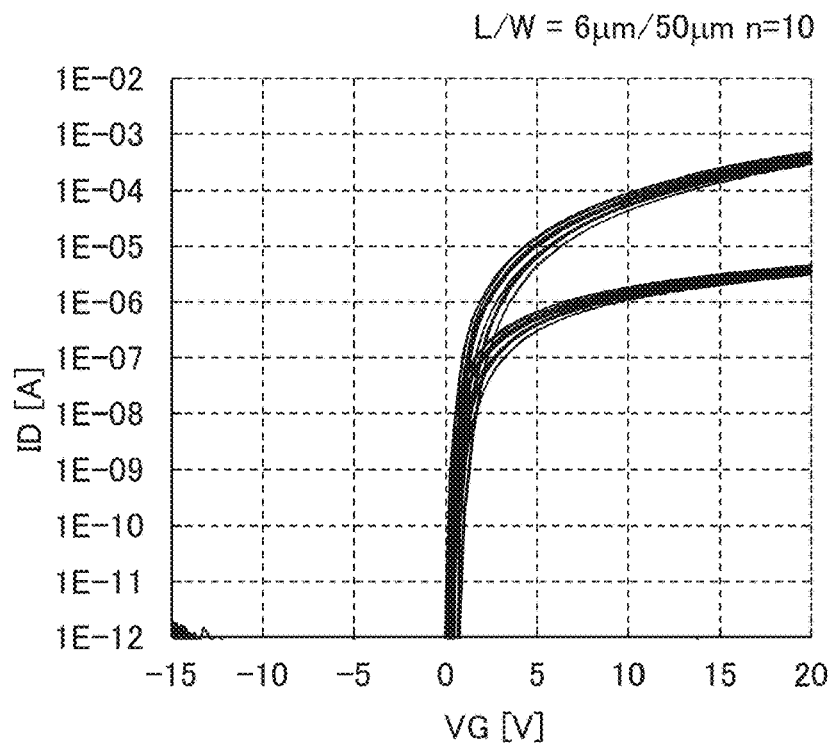
FIGS. 24A-24B Electrical characteristics of transistors related to Example 2.
Figure 24B:
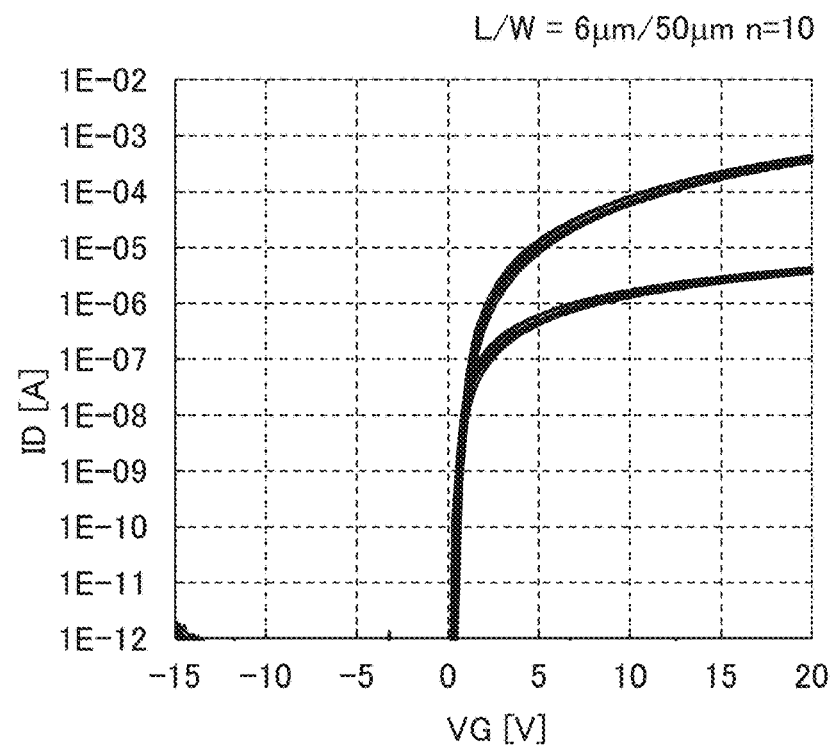

FIGS. 24(A) and 24(B) show the ID-VG characteristics of Sample B1 and Sample B2, respectively. The measured transistors each have a channel length of 6 μm and a channel width of 50 μm. The results of measuring 10 transistors for each are shown.

As shown in FIGS. 24(A) and 24(B), each of the samples shows favorable electrical characteristics. As for Sample B2, in particular, the variation is smaller as compared with Sample B1, and all the transistors that were measured exhibit normally-off characteristics.

The reason for Sample B2 having a smaller variation is considered to be as follows: oxidation of the source electrode and the drain electrode was prevented, whereby metal elements contained in the source electrode and the drain electrode were suitably prevented from being scattered to the back channel side of the semiconductor layer during the plasma treatment or during the later formation of the protective insulating layer (silicon oxynitride film).

From the above results, it was confirmed that using conductive films containing copper as the source electrode and the drain electrode and performing plasma treatment using a mixed gas of a gas containing an oxygen element and a gas containing a hydrogen element in a state where the conductive films are uncovered enabled oxygen to be supplied to the back channel of the semiconductor layer without oxidation of the surface of the conductive films containing copper and a transistor with good electrical characteristics to be obtained.

REFERENCE NUMERALS 100, 100A to 100F: transistor, 102: substrate, 104, 112a, 112b, 113a to 113c, 120a, 120b: conductive layer, 106, 114, 116: insulating layer, 108, 108a, 108b: semiconductor layer, 108af, 108bf: metal oxide film, 113af, 113bf, 113cf: conductive film, 113bo: oxide, 130, 130a: plasma, 142a, 142b, 142c: opening

The invention claimed is:

1. A method of fabricating a semiconductor device, comprising:
a first step of forming a semiconductor layer containing a metal oxide;
a second step of forming a conductive film over the semiconductor layer;

a third step of etching the conductive film such that the conductive film is divided over the semiconductor layer and a portion of the semiconductor layer is uncovered;

a fourth step of performing first treatment on exposed top and side surfaces of the conductive film and the portion of the semiconductor layer; and a fifth step of forming a first insulating film containing an oxide to be in contact with the conductive film and the semiconductor layer, wherein the conductive film contains copper, silver, gold, or aluminum, wherein the first treatment is plasma treatment in an atmosphere containing a mixed gas of a first gas containing an oxygen element but not containing a hydrogen element and a second gas containing a hydrogen element but not containing an oxygen element, wherein the first insulating film is formed by a plasma-enhanced chemical vapor deposition method using a film formation gas containing the first gas and a third gas containing a silicon element, and wherein the fifth step is successively performed after the fourth step without exposure to the air.

2. The method of fabricating a semiconductor device, according to claim 1, wherein the first treatment in the fourth step is performed with the flow rates of the first gas and the second gas to be supplied to a treatment chamber being controlled such that the flow rate of the second gas is 0.5% to 100% inclusive when the flow rate of the first gas is 100%.

3. The method of fabricating a semiconductor device, according to claim 1, wherein the first gas contains $N_2O$ or $O_2$, and wherein the second gas contains $NH_3$ or $H_2$.

4. The method of fabricating a semiconductor device, according to claim 1, wherein the fourth step and the fifth step are performed in the same treatment chamber at the same temperature.

5. The method of fabricating a semiconductor device, according to claim 1, wherein the semiconductor layer is formed in the first step in such a manner that a first metal oxide film and a second metal oxide film are formed in this order, and then the first metal oxide film and the second metal oxide film are processed into an island shape by etching, and wherein the second metal oxide film is formed to have higher crystallinity than the first metal oxide film.

6. The method of fabricating a semiconductor device, according to claim 1, further comprising:

a sixth step of forming a first conductive layer before the first step; and a seventh step of forming a second insulating layer covering the first conductive layer between the sixth step and the first step, wherein the semiconductor layer is formed in the first step to overlap with the first conductive layer.

7. A method of fabricating a semiconductor device, comprising:

a first step of forming a semiconductor layer containing a metal oxide;

a second step of forming a first conductive film, a second conductive film, and a third conductive film in this order over the semiconductor layer;

a third step of etching the first conductive film, the second conductive film, and the third conductive film such that the first conductive film, the second conductive film, and the third conductive film are divided over the semiconductor layer and a portion of the semiconductor layer is uncovered;

a fourth step of performing first treatment on an exposed top surface of the first conductive film, side surfaces of the first to third conductive films and the uncovered portion of the semiconductor layer; and a fifth step of forming a first insulating film containing an oxide to be in contact with the second conductive film and the semiconductor layer, wherein the second conductive film contains copper, silver, gold, or aluminum, wherein the first treatment is plasma treatment in an atmosphere containing a mixed gas of a first gas containing an oxygen element but not containing a hydrogen element and a second gas containing a hydrogen element but not containing an oxygen element, wherein the first insulating film is formed by a plasma-enhanced chemical vapor deposition method using a film formation gas containing the first gas and a third gas containing a silicon element, and wherein the fifth step is successively performed after the fourth step without exposure to the air.

8. The method of fabricating a semiconductor device, according to claim 7, wherein the first conductive film and the third conductive film contain an element different from the second conductive film, and each independently contain any of titanium, tungsten, molybdenum, chromium, tantalum, zinc, indium, platinum, and ruthenium.

9. The method of fabricating a semiconductor device, according to claim 2, wherein the first treatment in the fourth step is performed with the flow rates of the first gas and the second gas to be supplied to a treatment chamber being controlled such that the flow rate of the second gas is 0.5% to 100% inclusive when the flow rate of the first gas is 100%.

10. The method of fabricating a semiconductor device, according to claim 7, wherein the first gas contains $N_2O$ or $O_2$, and wherein the second gas contains $NH_3$ or $H_2$.

11. The method of fabricating a semiconductor device, according to claim 7, wherein the fourth step and the fifth step are performed in the same treatment chamber at the same temperature.

12. The method of fabricating a semiconductor device, according to claim 7, wherein the semiconductor layer is formed in the first step in such a manner that a first metal oxide film and a second metal oxide film are formed in this order, and then the first metal oxide film and the second metal oxide film are processed into an island shape by etching, and wherein the second metal oxide film is formed to have higher crystallinity than the first metal oxide film.

13. The method of fabricating a semiconductor device, according to claim 7, further comprising:

a sixth step of forming a first conductive layer before the first step; and a seventh step of forming a second insulating layer covering the first conductive layer between the sixth step and the first step, wherein the semiconductor layer is formed in the first step to overlap with the first conductive layer.

* * * * *